(12) United States Patent
Manlio

(10) Patent No.: US 12,501,992 B2
(45) Date of Patent: Dec. 23, 2025

(54) CONFIGURABLE ONE-SIZE FRONT-FREE HAND WEARABLE

(71) Applicant: Datalogic IP Tech S.R.L., Calderara di Reno (IT)

(72) Inventor: Galanti Manlio, San Giovanni in Persiceto (IT)

(73) Assignee: DATALOGIC IP TECH S.R.L., Bologna (IT)

( * ) Notice: Subject to any disclaimer, the term of this patent is extended or adjusted under 35 U.S.C. 154(b) by 192 days.

(21) Appl. No.: 18/369,951

(22) Filed: Sep. 19, 2023

(65) Prior Publication Data

US 2025/0089882 A1   Mar. 20, 2025

(51) Int. Cl.
A45F 5/00 (2006.01)

(52) U.S. Cl.
CPC .......... *A45F 5/00* (2013.01); *A45F 2005/008* (2013.01)

(58) Field of Classification Search
CPC ............. A45F 2005/008; A45F 5/1516; Y10S 224/93; H04B 1/385; H04B 2001/3861; G06K 7/10891; G06K 2007/10534; A41D 19/0037; G06F 3/014
USPC ................................................. 224/218, 930
See application file for complete search history.

(56) References Cited

U.S. PATENT DOCUMENTS

| | | | |
|---|---|---|---|
| 11,805,829 B2 * | 11/2023 | Kettner | A41D 19/0024 |
| 11,882,923 B2 * | 1/2024 | Theron | A45F 5/00 |
| 2014/0249944 A1 | 9/2014 | Hicks | |
| 2015/0100445 A1 | 4/2015 | Johnson | |
| 2023/0112442 A1 * | 4/2023 | Kettner | G06K 7/1417 2/160 |
| 2024/0138546 A1 * | 5/2024 | Gao | A45F 5/00 |

OTHER PUBLICATIONS

European search report in EU filing corresponding to the instant application. (6 pages).
Zebra RS5100 Ring Scanner Quick Start Guide dated 2019. (12 pages).
Honeywell 8675i Rugged Compact Wearable Scanner Quick Start Guide dated 2021-2022. (18 pages).
Newland AIDC, "Supercharge Your Operational Efficiency with Newland AIDC's BS20 Ring Scanner: The Future of Wearable Barcode Scanning", Sep. 11, 2023. (1 page).
Proglove, Wearable Scanner, "Transform Workflows for the Better", Apr. 5, 2023 (8 pages).

* cited by examiner

*Primary Examiner* — Adam J Waggenspack
(74) *Attorney, Agent, or Firm* — The Juhasz Law Firm

(57) ABSTRACT

Hand wearable support for a bar code scanner comprises back and front sides. The front side includes a V-member, first and second harness straps attached thereto extending away from each other at an angle, and means along the V-member for releasably attaching the front to the back side of the support which further comprises a back of the hand portion, a thumb portion, a trigger attachment portion, and first and second strap attachment portions each including a buckle. The first and second harness straps of the front side include a tongue portion for threading through the first and second buckle and folding back to releasably attach to itself. Releasable attachment of a trigger device, bar code scanner attachment, and bar code scanner to trigger attachment portion, bar code scanner attachment portion, and bar code scanner attachment portion, respectively, forms a bar code scanner assembly in the form factor of a support wearable by a user to perform scanning operations.

16 Claims, 28 Drawing Sheets

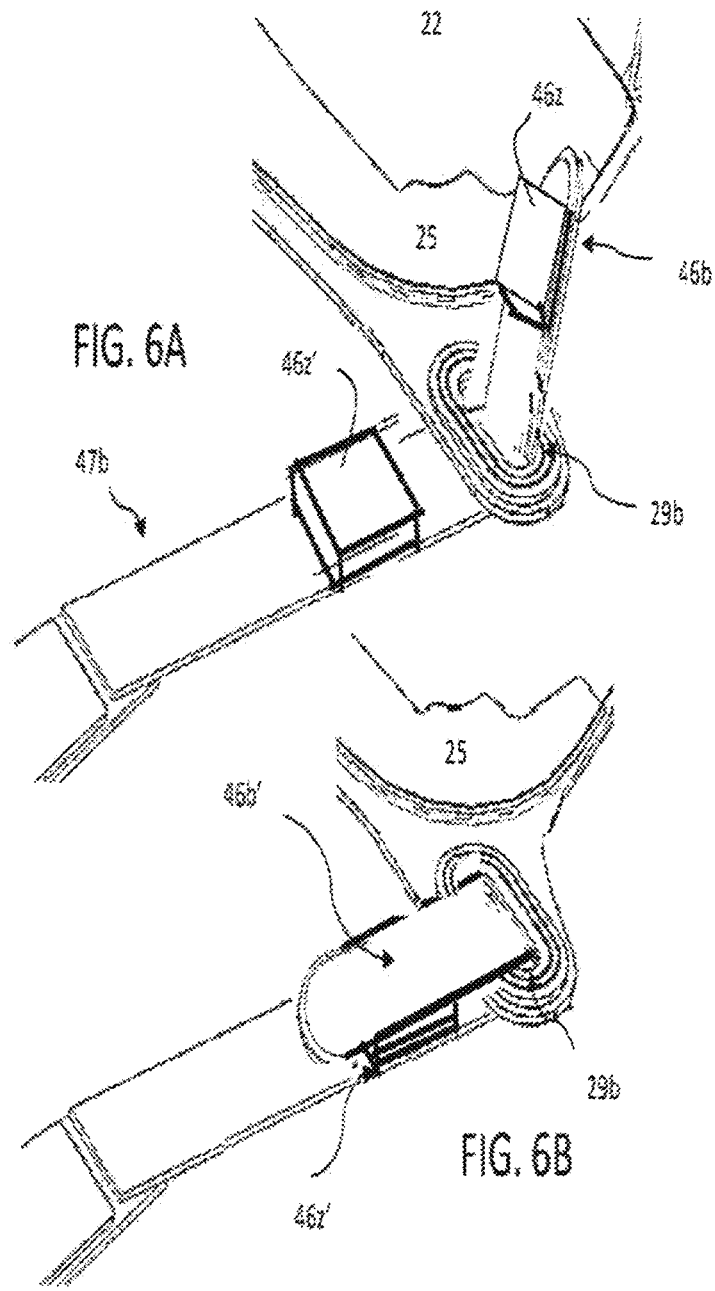

From FIG. 10A

1010

1042 — forming a front side 40 of the hand wearable support 10 by the steps of:

forming a V-member 41, the V-member 41 including a terminal body end 42, a terminal first arm end 44a, a terminal second arm end 44b, the terminal first arm end 44a and the terminal second arm end 44b extending away from the terminal body end 41 and forming an angle α 44a between the terminal first arm end 44a and the terminal second arm end 44b;

forming a first harness strap 47a, the first harness strap 47a extending from the terminal first arm end 44a of the V-member 41, the first harness strap 47a including a tongue portion 46a, the tongue portion 46a of the first harness strap 47a configured to thread through buckle 29a of the first strap attachment portion 27a and to fold back onto the first harness strap 47a to form a folded back tongue portion 46a', the folded back tongue portion 46a' of the first harness strap 47a including a means 49a underneath the fold of the folded back tongue portion 46a' for securing the folded back tongue portion 46a' of the first harness strap 47a to a means 49a' above the first harness strap 47a for releasably attaching the folded back tongue portion 46a' to the first harness strap 47a;

forming a a second harness strap 47b, the second harness strap 47b extending from the terminal first arm end 44b of the V-member 41, the second harness strap 47b including a tongue portion 46b, the tongue portion 46b of the second harness strap 47b configured to thread through buckle 29b of the second strap attachment portion 27b and to fold back onto the second harness strap 47b to form a folded back tongue portion 46b', the folded back tongue portion 46b' of the second harness strap 47b including a means 49b underneath the fold of the folded back tongue portion 46b' for securing the folded back tongue portion 46b' of the second harness strap 47b to a means 49b' above the second harness strap 47b for releasably attaching the folded back tongue portion 46b' to the second harness strap 47b;

forming means 43 along the V-member 41 for releasably attaching the front side 40 of the hand wearable support 10 to the means 32 for releasably attaching to the attachment portion 30 of the back side 20 of the hand wearable support 10 to form the hand wearable support 10 for a bar code scanner;

CONFIGURABLE ONE-SIZE FRONT-FREE HAND WEARABLE

FIELD OF INVENTION

This disclosure relates to a hand wearable and more particularly to a hand wearable for use with barcode scanners.

BACKGROUND

Bar code readers are well known devices. A bar code includes a series of encoded symbols. Each symbol consists of a series of light and dark regions, rectangular in shape and referred to as bars. The widths of the bars, and the widths of the light spaces between the bars indicate the encoded information. A bar code reader illuminates the bar code, captures the light reflected from the code, determines the widths and spacings of the code symbols, and derives the encoded data from those widths and spacings.

Bar code readers are powerful tools that can save time, reduce labor costs, reduce worker error, improve inventory control, and enable better customer service. Bar code readers may be fixed mounted, that is, installed in a stationary location like for reading items on a moving conveyor belt; in-counter, that is, they are integrated into a counter, like a retail point-of-sale counter; on-counter, that is, they rest on a counter; part of a mobile computing device, like a smart device; hand-held, typically in the form factor of a pistol; and a wearable, like a bar code reader integrated into a ring or wearable artifact like a hand wearable, like a glove.

Wearable barcode readers may be useful where an operator needs his or hands free to touch, lift, hold, or otherwise manipulate objects. For example, a wearable bar code reader may allow the operator to engage in tasks like lifting and moving boxes with the bar code reader ready for scanning a bar code by simple activation of the trigger when the need arises.

Many wearable barcode readers embed a trigger device into a hand wearable that is of a mechanical form factor, like a physical push-button mechanism. Activation of the push-button is typically by pressing down on the button. Electrical sensors activated by touch or motion or in other ways may also be used.

A wearable barcode reader in the form factor of a glove poses many design challenges. One problem faced by wearable barcode readers in the form factor of a glove is that a glove covers both the back of the hand and the palm of the hand. The design of gloves typically surrounds all of the hand with wearable material. The hand wearable is thus sized for a custom fit to an operator. This limits the use of the glove to the operator or others having a similar hand configuration as the operator. That in turn may require an organization to buy a glove for each operator which increases the cost of outfitting workers with hand wearables required to perform their jobs.

In a wearable barcode reader in the form factor of a conventional glove, the material of the glove also covers most of the hand with one or more layers of material. Such a design can cause heat and moisture generated by the hand to be built up and contained inside the wearable. Wetting of the inside of the wearable and accumulation of biomaterial inside the wearable from a hand may introduce hygiene problems that may make the hand wearable unfit for distribution among and wear by multiple operators within an organization.

To address these problems, the glove wearable may be designed to cover less of the hand. In one approach, a glove supporting the bar code scanner includes a back of the hand portion and straps along the palm of the hand that releasably attach to the back of the hand portion to form a glove about the hand of the operator. In another approach, a glove supporting the bar code scanner includes a hand portion that extends along the back of the hand and the palm of the hand. Means may be provided to the terminal ends of the back and palm of the hand portions to releasably secure them together to form a glove about the hand of the operator. These designs focus on releasably securing the parts of the glove together about the hand. There seems to be less attention paid to efficiency, comfort, fit and other ergonomic aspects of the glove to the user.

Conventional gloves also appear to be limited in their adjustability. This further limits the glove to a particular size and form factor of a hand.

Another problem faced by conventional hand wearable barcode scanners is that the trigger device and associated components may be integrated into the hand wearable. This means that any failure of the hand wearable that requires the hand wearable to be retired from operation also results in retiring of the trigger device and associated electronics since they are integrated into the hand wearable. Thus, the trigger device and associated electronics are forced into retirement due to the retirement of the wearable even if the trigger device and associated electronics are still operable. Early retirement of the trigger device and associated electronics lead to increased total cost of the hand wearable barcode scanner and its sustainability in an organization since trigger devices and associated electronics are needing to be replaced earlier than may be necessary because of the failure of the hand wearable even when the trigger devices and associated electronics are perfectly operational.

All of the foregoing and other problems present genuine issues for hand wearables configured for use in barcode scanning. There is a need for a hand wearable for a barcode scanning device that lends itself to better ergonomics and longer use among a wider group of operators across an organization. This disclosure addresses that need.

SUMMARY

In illustrative embodiments, disclosed is a hand wearable support 10 for a bar code scanner. The hand wearable support 10 comprises a back side 20 of the hand wearable support 10 and a front side 40 of the hand wearable support 10 configured to wrap around a front of a hand when in use. The back side 20 of the hand wearable support 10 comprises a bar code scanner attachment portion 22, a thumb portion 24, a trigger attachment portion 26, a first and second strap attachment portions 27a. 27b each including a buckle 29a. 29b, and an attachment portion 30 along the back side 20 of the hand wearable support 10. The attachment portion 30 along the back side 20 of the hand wearable support 10 includes a means 32 for securing the attachment portion along the back side 20 of the hand wearable support 10 to the front side of the hand wearable support 40 about a hand. The front side 40 of the hand wearable support 10 includes a V-member 41, a first harness strap 47a and a second harness strap 47b attached thereto and extending away from each other at an angle α 45, and a means 43 along the V-member 41 for releasably attaching the front side 40 of the hand wearable support 10 to the means 32 for releasably attaching to the attachment portion 30 of the back side 20 of the hand wearable support 10. Each of the first and second harness strap portions includes a tongue portion 46a configured to thread through the first and second buckle 29a, 29b of the first and second strap attachment portions and to fold back onto a first and second means 49a underneath the fold of the folded back tongue portions for securing the folded back tongue portions to the means 49a', 49b' above the first and second strap attachment portions for releasably attaching the folded back tongue portions to the first and second harness straps. The means 43 along the V-member 41 is configured for releasably attaching the front side 40 of the hand wearable support 10 to the means 32 for releasably attaching to the attachment portion 30 of the back side 20 of the hand wearable support 10 to form the hand wearable support 10 for receiving a bar code scanner.

In illustrative assemblies, the hand wearable support 10 for a bar code scanner is combined with a trigger device and/or a bar code scanner attachment with or without a bar code scanner. With the trigger device the trigger device may be releasably attached to the trigger attachment portion 26. With the bar code scanner attachment, the bar code scanner attachment may be releasably attached to the bar code scanner attachment portion 22. The bar code scanner attachment may be used with or without a bar code scanner attached to the bar code scanner attachment portion 22. All three of trigger device, bar code scanner attachment, and scanner form a bar code scanner assembly that is in the form factor of a support wearable by a user to perform scanning operations.

DESCRIPTION OF DRAWINGS

FIGS. 1A, 1B herein collectively FIG. 1.

FIGS. 2A, 2B, 2C herein collectively FIG.

FIGS. 3A through 3E herein collectively FIG. 3.

FIG. 6A depicts a threading of a tongue portion of a strap attachment portion of a front side of a hand wearable support through a buckle on a back of the hand side of the hand wearable support of this disclosure; and FIG. 6B depicts a means for securing the front side to the back side of the hand wearable support of this disclosure. FIGS. 6A and 6B herein collectively FIG. 6.

FIGS. 7A, 7B, and 7C herein collectively FIG. 7.

FIGS. 8A and 8B herein collectively FIG. 8.

FIGS. 10A, 10B, 10C depict illustrative method for manufacturing a hand wearable support 10 for a bar code scanner. FIGS. 10A, 10B, and 10C herein collectively FIG. 10.

FIGS. 11A and 11B herein collectively FIG. 11.

DETAILED DESCRIPTION

Figure 1A:
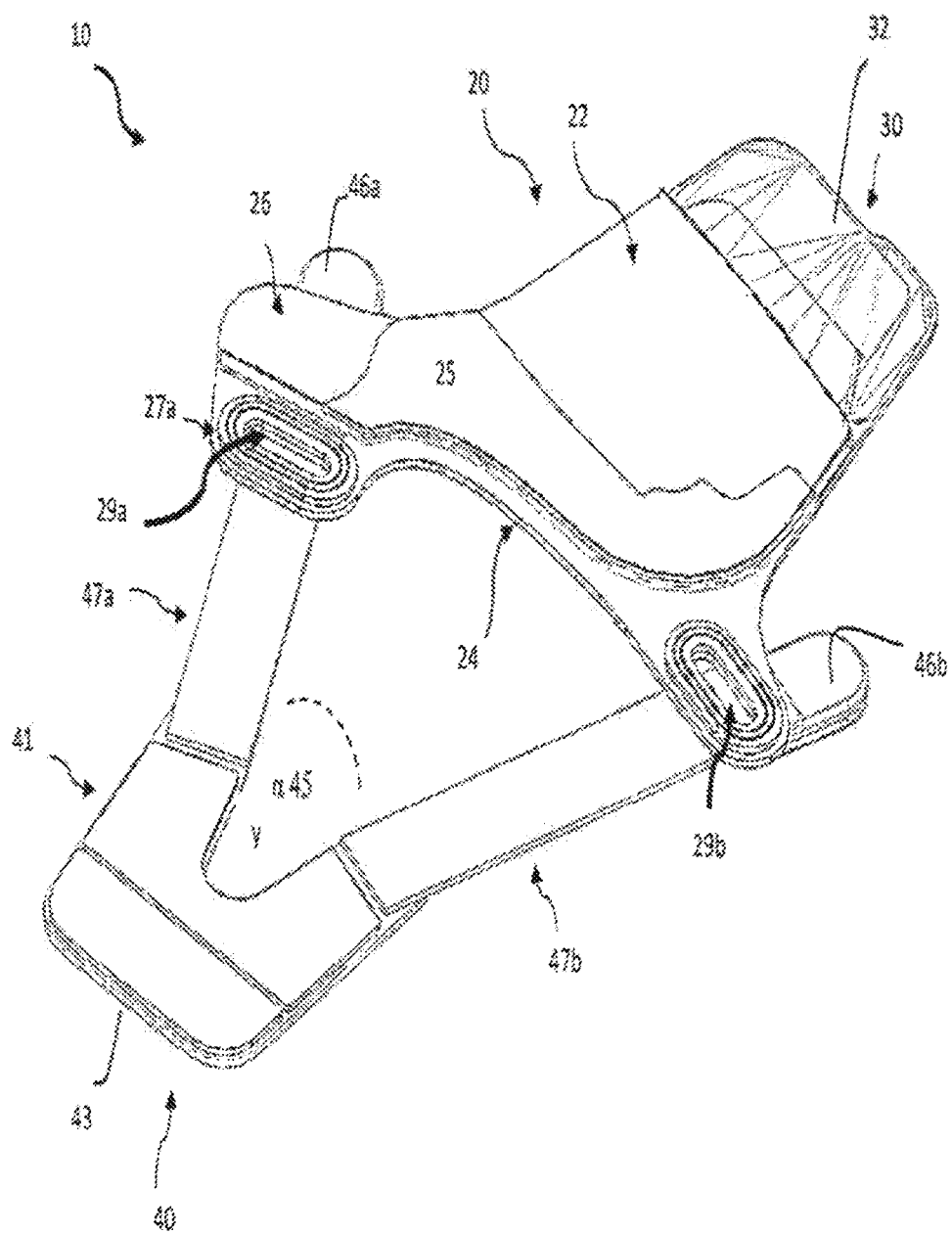
FIG. 1A depicts a perspective view of a hand wearable support 10 for a bar code scanner.

In the following detailed description, reference is made to the accompanying drawings that form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Figure 1B:
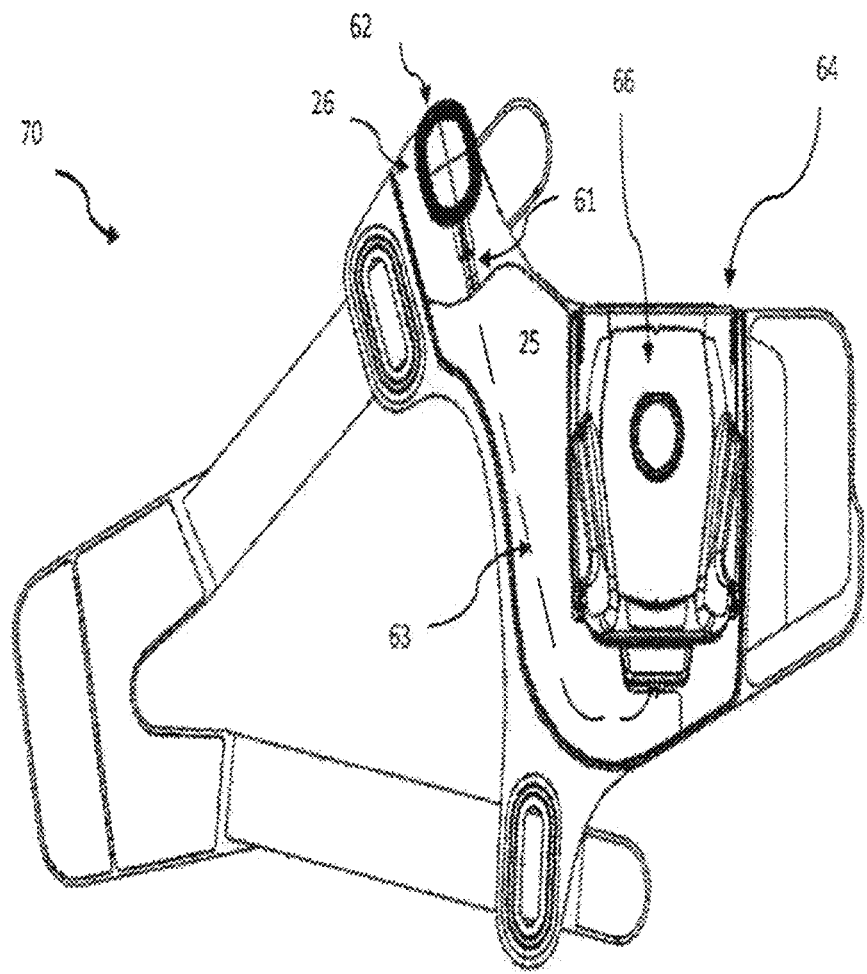
FIG. 1B depicts a plan view of the hand wearable support 10 for a bar code scanner shown in FIG. 1A assembled with a trigger device, a bar code scanner attachment, and a bar code scanner in accordance with this disclosure.
Figure 8A:
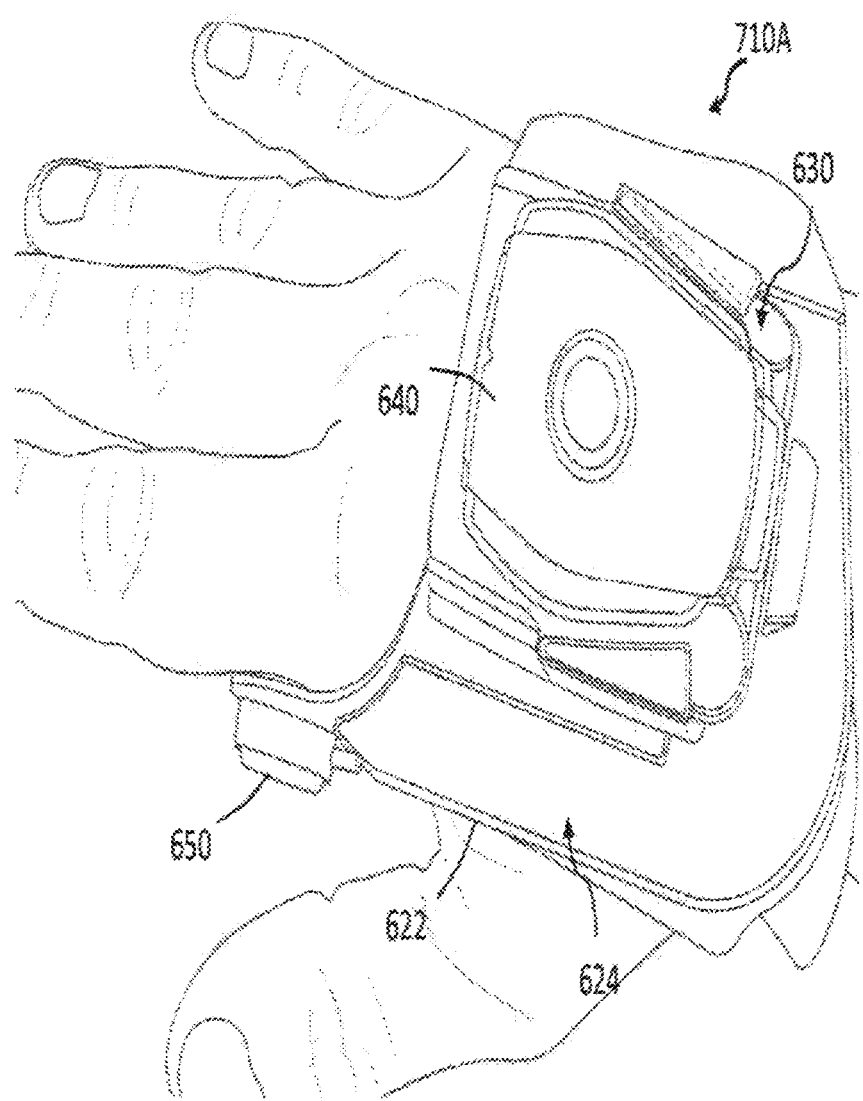
FIGS. 8A and 8B depict top and bottom views, respectively, of the hand wearable support 10 assembled with bar code scanner attachment portion and bar code scanner as worn on the hand.

Broadly speaking, as depicted in FIG. 1A, disclosed is a hand wearable support 10 for a bar code scanner comprising a back side 20 and a front side 40. The front side 40 includes a V-member 41, a first harness strap 47a and a second harness strap 47b attached thereto extending away from each other at an angle 45, and means 43 along a bottom side of the V-member 41 for releasably attaching the front side 40 to an attachment portion 30 on the back side 20 of the support 10 which back side 20 further comprises a bar code scanner attachment portion 22, a thumb portion 24, a trigger attachment portion 26, and first and second strap attachment portions 27a. 27b. respectively, each including a buckle 29a, 29b, respectively. The first and second harness straps 47a, 47b, respectively, of the front side 40 each include a tongue portion 46a, 46b, respectively, for threading through the first and second buckle 27a, 27b, respectively, and folding back to releasably attach via attachment means 49a, 49b (shown in FIG. 2B), respectively to itself along first and second harness strap portions 47a, 47b, respectively. As depicted in FIGS. 1B and 8A, releasable attachment of a trigger device 62, bar code scanner attachment 64, and bar code scanner 66 to trigger attachment portion 26, bar code scanner attachment portion 22, and bar code scanner attachment 65, respectively, forms a bar code scanner assembly 70 in the form factor of a support wearable by a user to perform scanning operations. A releasable thumb portion overlay 25 may be configured to overlay a wire 63 electrically connecting the trigger device 62 to the bar code scanner 66 for carrying electrical signals generated by the trigger 62 to the bar code scanner 66.

Figure 2A:
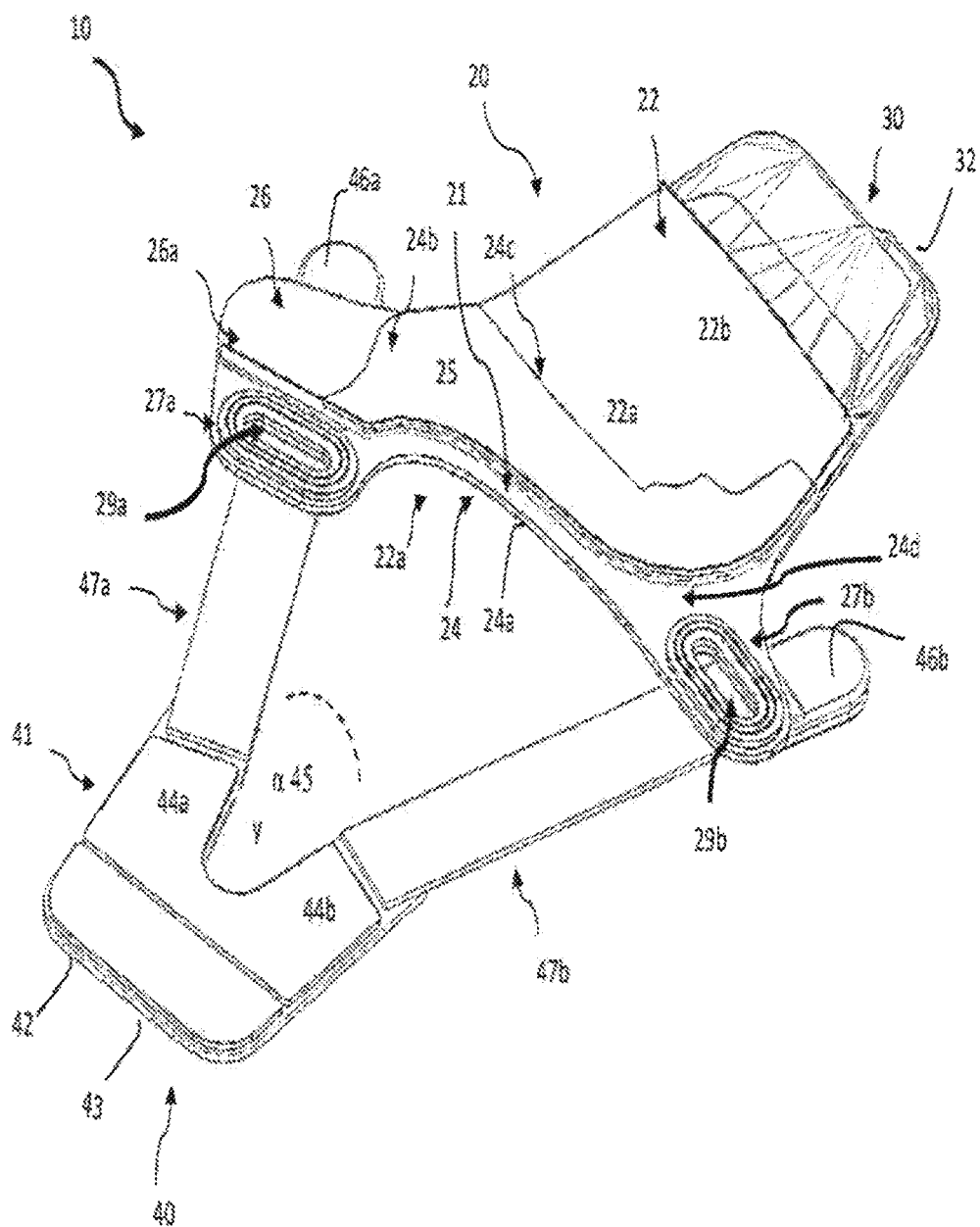
FIG. 2A depicts a more detailed top perspective view.
Figure 2B:
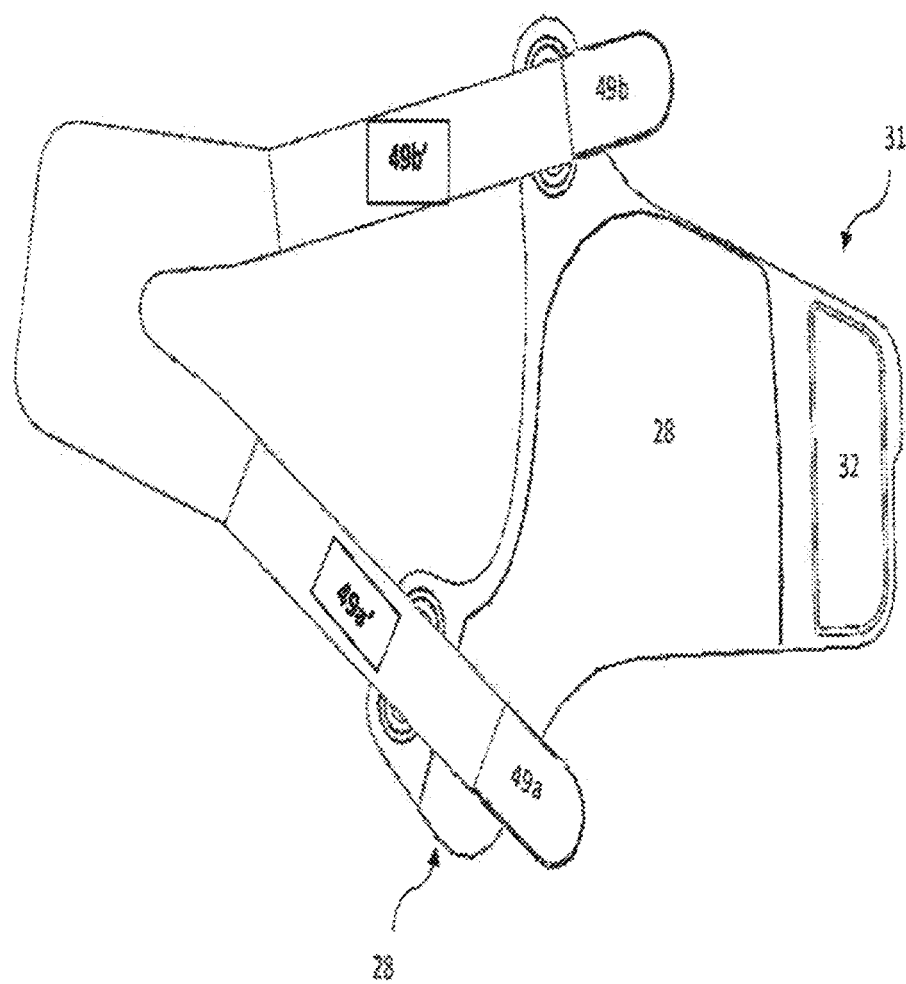
FIG. 2B depicts a more detailed bottom plan view.

FIGS. 2A, 2B depict more detailed top perspective and bottom plan views of the hand wearable support 10 for a bar code scanner shown in FIG. 1. The hand wearable support 10 comprises the back side 20 of the hand wearable support 10 configured to wrap around the back of a hand and the front side 40 of the hand wearable support 10 configured to wrap around a front of a hand when in use.

The back side 20 of the hand wearable support 10 comprises the bar code scanner attachment portion 22, the thumb portion 24, the trigger attachment portion 26, the first and second strap attachment portions 27a. 27b each including a buckle 29a, 29b, respectively, and the attachment portion 30 along the back side 20 of the hand wearable support 10.

The thumb portion 24 runs along a first side 22a of the back side 20 of the hand wearable support 10. The thumb portion 24 defines a terminal end 24a.

The trigger attachment portion 26 runs along a top side 24b of the thumb portion 24. The trigger attachment portion 26 is configured to attachably receive the trigger 62 (depicted in FIG. 1B) for activating the bar code scanner 66 (depicted in FIG. 1B); A hook (or loop) Velcro® fastener may be applied to the bottom of the trigger 62 to releasably secure to a loop (or hook) Velcro® fastener to secure the trigger to the trigger attachment portion 26. It will be appreciated that while Velcro® is disclosed as a fastener for use with this disclosure, any fastener that provides the affixation function of the element in which Velcro® is taught as an example may be used in place of Velcro® to provide the disclosed affixation. For instance, an adhesive or other securing material may be applied to a bottom surface of the trigger 62 to adhere the trigger to the trigger attachment portion 26. Other affixation alternatives to Velcro® may include buttons and buttonholes, snaps, magnets, restickable adhesive, and so on. The securement of a trigger to the trigger attachment portion 26 is a design choice well known to those skilled in the art.

An outer side 21 of the thumb portion 24 of the hand wearable support 10 may be provided with a releasable thumb portion overlay 25. The releasable thumb portion overlay 25 may be configured to overlay a wire 63 electrically connecting the trigger device to the bar code scanner for carrying electrical signals generated by the trigger to the bar code scanner.

The first strap attachment portion 27a runs along a first side 26a of the trigger attachment portion 26. The first strap attachment portion 27a includes the buckle 29a.

The second strap attachment portion 27b runs along a bottom side 24d of the thumb portion 24. The second strap attachment portion 27b includes the buckle 29b.

The bar code scanner attachment portion 22 is a portion of the back side 20 of the hand wearable support 10 that rests on the back side of the hand when the hand wearable support 10 is placed on the hand of an operator, The bar code scanner attachment portion 22 runs along an inside end 24c of the thumb portion 24. The bar code scanner attachment portion 22 is configured to attachably receive a bar code scanner attachment for receiving a bar code scanner 66 (in FIG. 1B).

The attachment portion 30 runs along the back side 20 of the hand wearable support 10. The attachment portion is configured for attachment to a front side 40 of the hand wearable support 10. The attachment portion 30 along the back side 20 of the hand wearable support 10 runs along an outside end 22b of the bar code scanner attachment portion 22. The attachment portion along the back side 20 of the hand wearable support 10 includes a means 32 along a bottom side 31 of the back side 20 of the hand wearable support 10 for securing the attachment portion 30 along the back side 20 of the hand wearable support 10 to the front side 40 of the hand wearable support 10 about a hand.

The front side 40 of the hand wearable support 10 comprises a V-member 41, a first harness strap 47a, a second harness strap 47b and a means 43 along the V-member 41 for releasably attaching the front side 40 of the hand wearable support 10 to the means 32 for releasably attaching to the attachment portion 30 of the back side 20 of the hand wearable support 10.

The V-member 41 includes a terminal body end 42, a terminal first arm end 44a, a terminal second arm end 44b. The terminal first arm end 44a and the terminal second arm end 44b extend away from the terminal body end 41. The extension of the terminal first arm end 44a and the terminal second arm end 44b away from each other forms an angle α 45 between the terminal first arm end 44a and the terminal second arm end 44b.

The first harness strap 47a extends from the terminal first arm end 44a of the V-member 41. The first harness strap 47a includes a tongue portion 46a. The tongue portion 46a of the first harness strap 47a is configured to thread through buckle 29a of the first strap attachment portion 27a and to fold back onto the first harness strap 47a to form a folded back tongue portion 46a' (see FIG. 6B which shows this feature for tongue 46b), the folded back tongue portion 46a' of the first harness strap 47a including a means 49a underneath the folded back tongue portion 46a' for securing the folded back tongue portion 46b' of the first harness strap 47a to a means 49a' above the first harness strap 47a for releasably attaching the folded back tongue portion 47a to the first harness strap 47a.

The second harness strap 47b extending from the terminal first arm end 44b of the V-member 41, the second harness strap 47b including a tongue portion 46b' (see FIG. 6B), the tongue portion 46b of the second harness strap 47b configured to thread through buckle 29b of the second strap attachment portion 27b and to fold back onto the second harness strap 47b to form a folded back tongue portion 46b', the folded back tongue portion 46b' of the second harness strap 47b including a means 49b underneath the fold of the folded back tongue portion 47b for securing the folded back tongue portion 46b' of the second harness strap 47b to a means 49b' above the second harness strap 47b for releasably attaching the folded back tongue portion 46b' to the second harness strap 47b.

Attaching the means 43 along the V-member 41 for releasably attaching the front side 40 of the hand wearable support 10 to the means 32 for releasably attaching to the attachment portion 30 of the back side 20 of the hand wearable support 10 forms the hand wearable support 10 for a bar code scanner.

Releasably attaching the folded back tongue portion 46a' of the first harness strap 47a to the first harness strap 47a, releasably attaching the folded back tongue portion 46b' of the second harness strap 47b to the second harness strap 47b, and releasably attaching the means 43 along the V-member to the means 32 for releasably along the attachment portion 30 for attaching to the front side 40 of the hand wearable support 10 forms the hand wearable support 10 configurable for scanning operations.

Figure 2C:
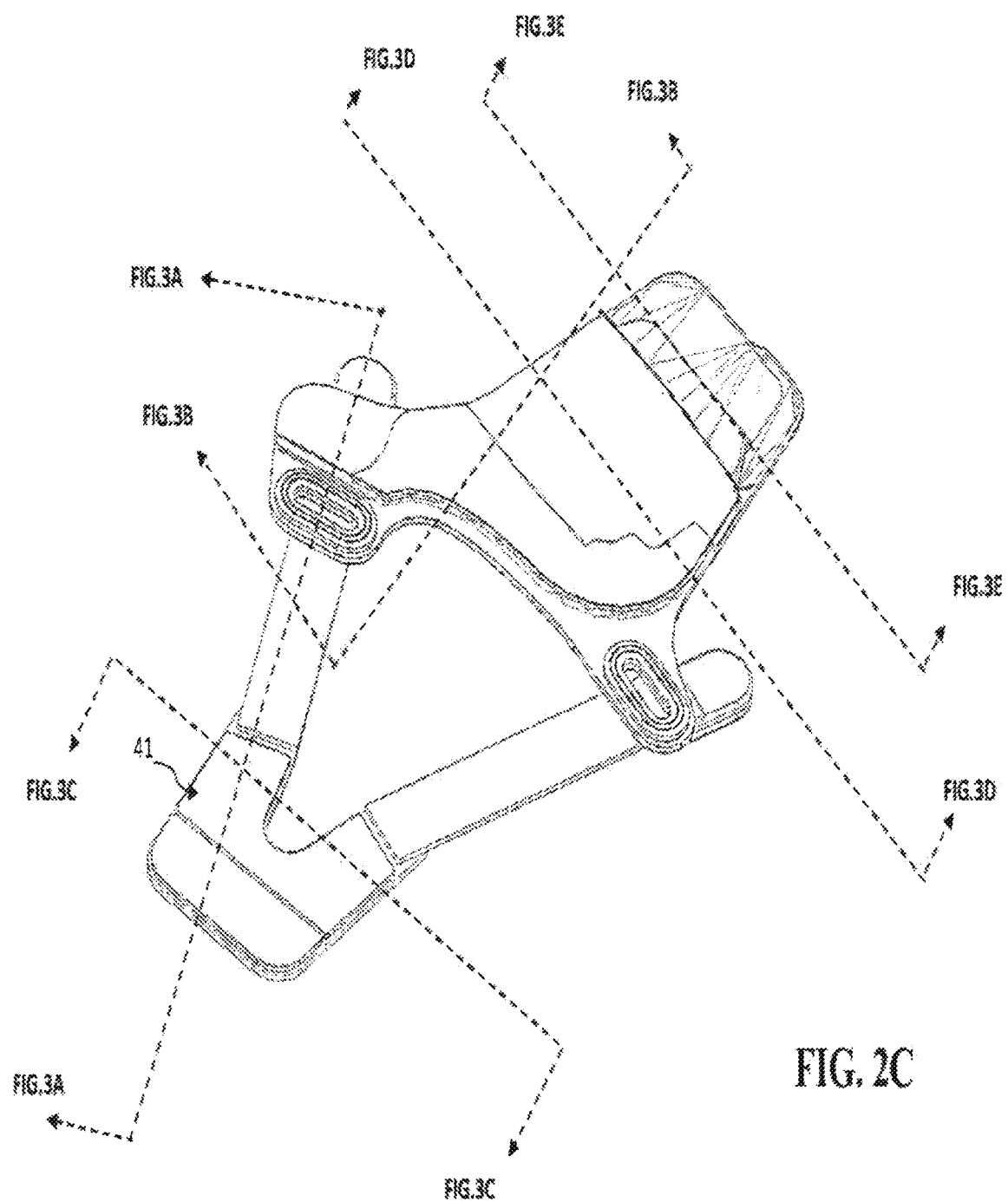
FIG. 2C depicts a more detailed perspective view of the hand wearable support 10 for a bar code scanner shown in FIG. 1.
Figure 3A:
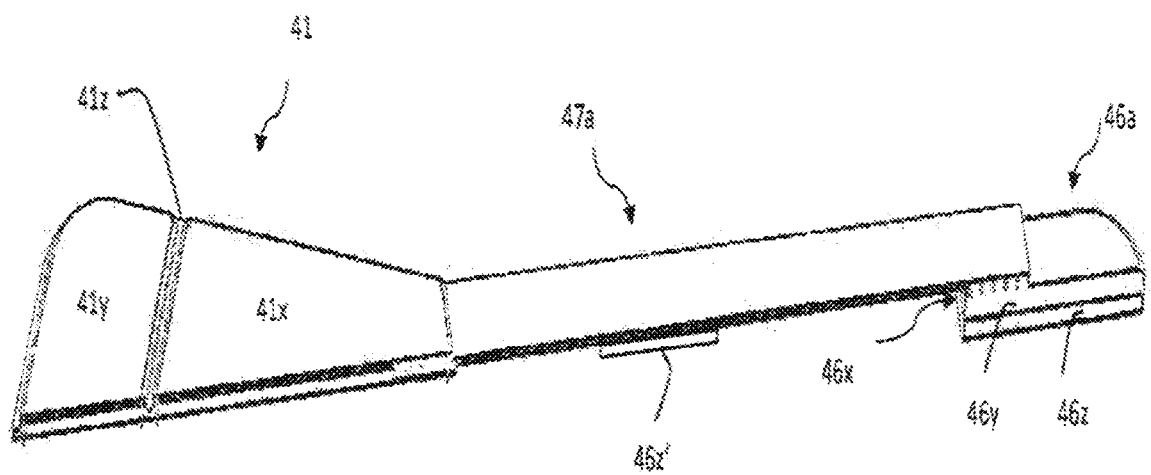
FIG. 3A is a depiction of a perspective cross section 3A-3A depicted in FIG. 2C of the of the front side 40 of the hand wearable support 10 depicted in FIG. 2C.
Figure 3B:
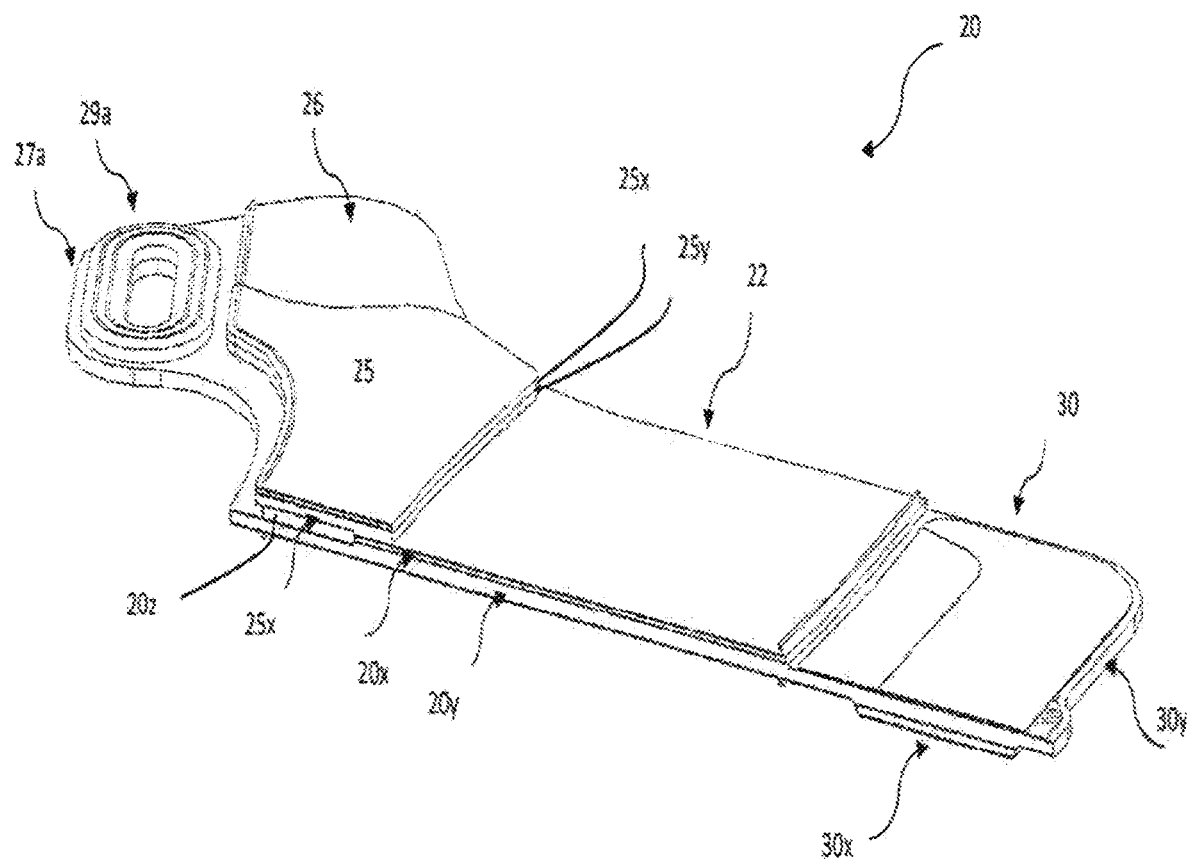
FIG. 3B is a depiction of perspective cross section 3B-3B depicted in FIG. 2C of the back side 20 of the hand wearable support 10 depicted in FIG. 2C.
Figure 3C:
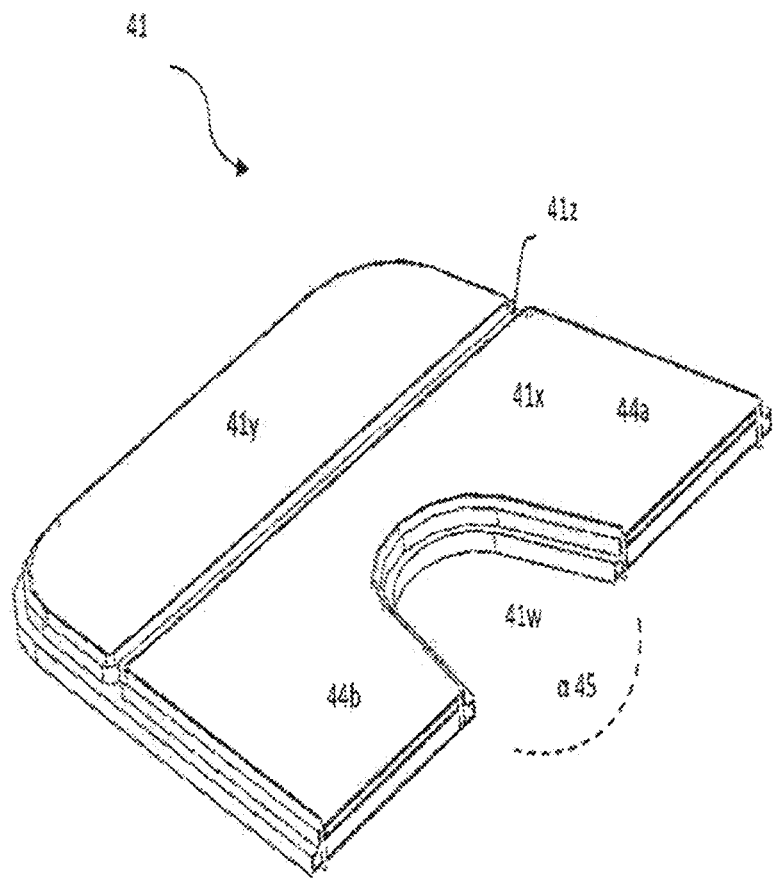
FIG. 3C is a depiction of a perspective cross section 3C-3C depicted in FIG. 2C of the V-member 41 of the front side 40 of the hand wearable support 10 depicted in FIG. 2C.
Figure 3D:
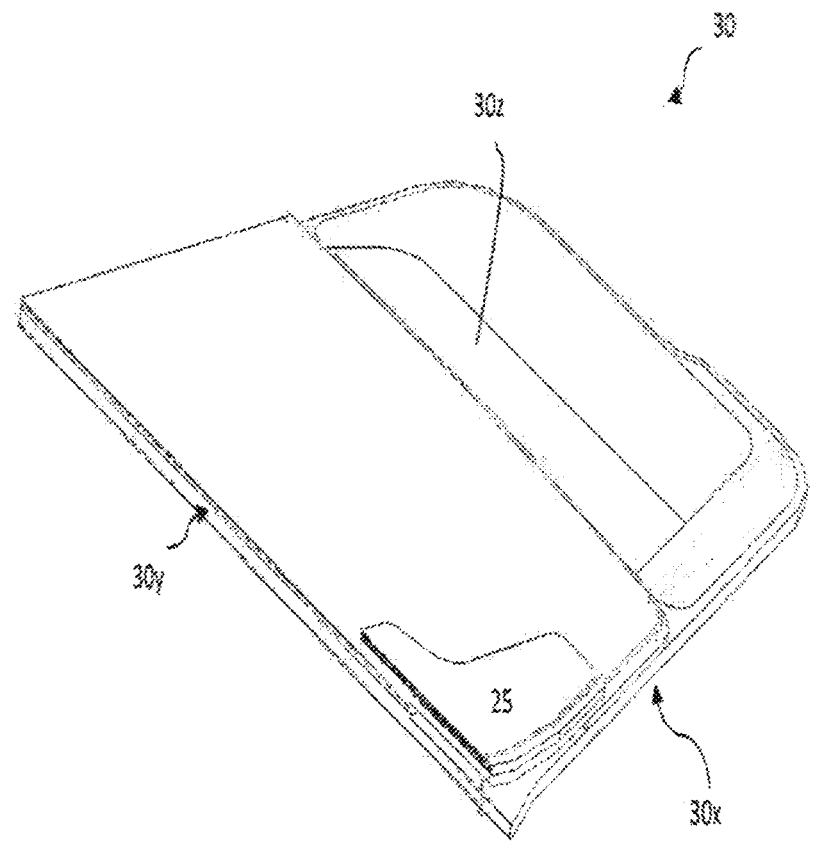
FIG. 3D is a depiction of a perspective cross section 3D-3D depicted in FIG. 2C of the back side 20 of the hand wearable support 10 depicted in FIG. 2C.
Figure 3E:
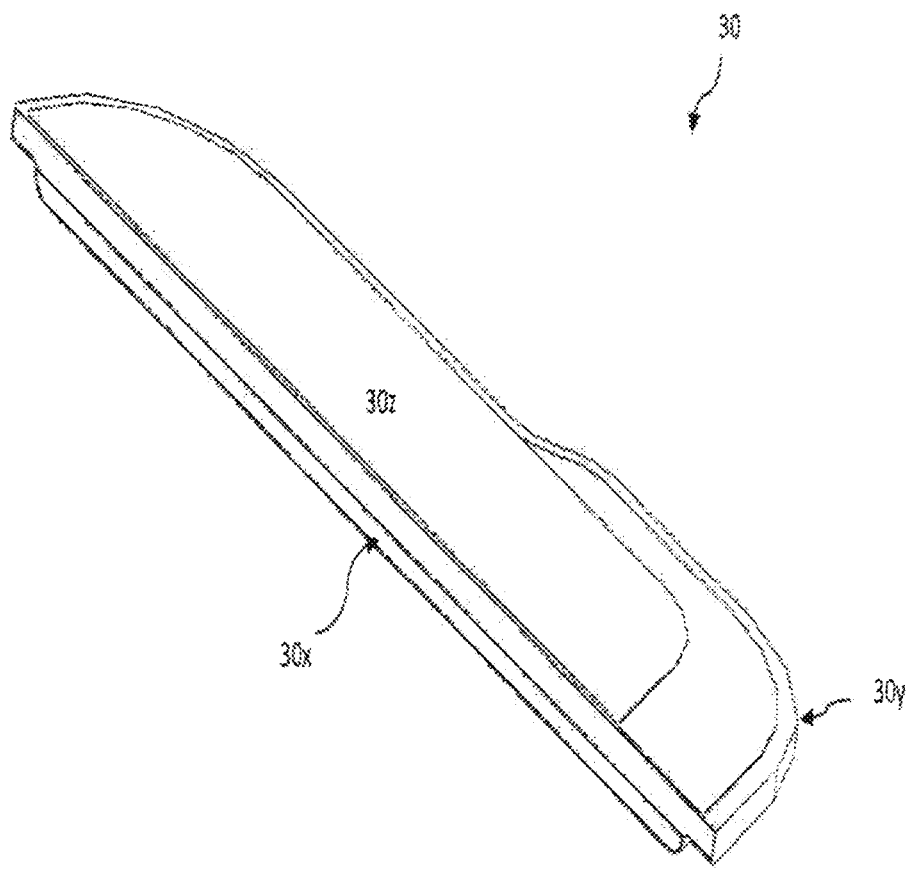
FIG. 3E is a depiction of a perspective cross section 3E-3E depicted in FIG. 2C of the back side 20 of the hand wearable support 10 depicted in FIG. 2C.

FIG. 3A is a perspective depiction of cross section 3A-3A depicted in FIG. 2C of the of the front side 40 of the hand wearable support 10 depicted in FIG. 2C. FIG. 3B is a perspective depiction of cross section 3B-3B depicted in FIG. 2C of the back side 20 of the hand wearable support 10 depicted in FIG. 2C. FIG. 3C is a perspective depiction of cross section 3C-3C depicted in FIG. 2C of the V-member 41 of the front side 40 of the hand wearable support 10 depicted in FIG. 2C. FIG. 3D is a perspective depiction of cross section 3D-3D depicted in FIG. 2C of the back side 20 of the hand wearable support 10 depicted in FIG. 2C. FIG. 3E is a perspective depiction of cross section 3E-3E depicted in FIG. 2C of the back side 20 of the hand wearable support 10 depicted in FIG. 2C. FIG. 3A through FIG. E collectively herein FIG. 3.

Turning to FIG. 3A, shown is the perspective depiction of cross section 3A-3A depicted in FIG. 2C of the of the front side 40 of the hand wearable support 10 depicted in FIG. 2C. The cross-section of the front side 40 shows the V-member 41, the first harness strap 47$a$, and the tongue portion 46$a$. The V-member 41 may illustratively be provided with a score line 41$z$ across the V-member 41 to define regions 41$y$ and 41$z$ of the V-member 41. The score line 41$z$ allows for the V-member 41 to better wrap around the hand of an operator by allowing region 41 to rotate about the score line 41Z about the region 41$x$ to better fit the contour of a hand when folded about the hand. The tongue portion 46$a$ includes a substrate 46$y$ which may be adhered to the first harness strap 47$a$ using an adhesive 46$x$, sonic welding or by other securement means. A Velcro® hook (or loop fastener 46$z$ illustratively adhered along a bottom of the tongue portion 46$a$ is configured to secure the tongue portion 46$a$ to a Velcro® loop (or hook) fastener 46$z'$ adhered along a mid-section of first harness strap 47$a$ after the tongue portion 46$a$ has been threaded through the buckle 29$a$ to secure the front side 40 to the back side 20 of the hand wearable support 10 as herein disclosed.

Turning to FIG. 3B, shown is the perspective depiction of cross section 3B-3B depicted in FIG. 2C of the back side 20 of the hand wearable support 10 depicted in FIG. 2C. The cross-section of the back side 20 of the support 10 the bar code scanner attachment portion 22, the trigger attachment portion 26, first strap attachment portion 27$a$, and attachment portion 30$x$. As shown, the bar code scanner attachment portion 22 and the trigger attachment portion 26 may be formed from a first single ply of material 20$x$. The first single ply of material 20$x$ may be secured by adhesive, sonic welding, stitching or other securement means 20$z$ to a second ply of material 20$y$ which is configured to lie against the hand. The first single ply of material 20$x$ may be a flexible, durable plastic, rubber, or other material with properties that allow the material to bend around a hand at the same time as supporting the bar code attachment, the bar code scanner and the other elements supported by the back side 20 of the hand wearable support 10. The second ply of material 20$y$ may have similar properties to the first single ply of material 20$x$ but have properties like softness, breathability, and so on, that also allow for a more comfortable fit to the hand. The releasable thumb portion overlay 25 may be a flexible, durable plastic, rubber, or other material with properties that allow the material to bend around a hand. A Velcro® hook (or loop fastener 25$x$ illustratively adhered along a bottom of the thumb portion overlay 25 may be configured to secure the thumb portion overlay 25 to a Velcro® loop (or hook) fastener 25$y$ located along the first single ply of material 20$x$. Attachment portion 30 may be an extension region 30$y$ of the second ply of material 20$y$. Alternatively, attachment portion 30 may be a separate ply of material secured to the second ply of material 20$y$ by adhesive, sonic welding, stitching or other securement means. Attachment portion 30 may be provided with a Velcro® hook (or loop fastener) 30$x$ illustratively adhered along a bottom of attachment portion 30 and configured to secure the attachment portion 30 to a Velcro® loop (or hook) fastener 25$y$ located along front side 20 of the hand wearable support 10. The plies may differ in shape and size. The material of these plies may include but not limited to natural leather, plastic, silicone, rubber, elastic polymer, or other suitable resilient material or any combinations thereof.

Turning to FIG. 3C, shown is the perspective depiction of cross section 3C-3C depicted in FIG. 2C of the V-member 41 of the front side 40 of the hand wearable support 10 depicted in FIG. 2C. The V-member 41 is shown illustratively provided with the score line 41$z$ across the V-member 41 to define the regions 41$y$ and 41$x$ of the V-member 41 as previously explained. As shown, region 41$x$ is provided with an arcuate shaped opening 41$w$, the shape of the arc defining the terminal first arm end 44$a$, the terminal second arm end 44$b$ which extend away from the terminal body end 41 so as to form an angle α 45 between the terminal first arm end 44$a$ and the terminal second arm end 44$b$ as shown.

Turning to FIG. 3D, shown is a perspective depiction of cross section 3D-3D depicted in FIG. 2C of the back side 20 of the hand wearable support 10 depicted in FIG. 2C. The releasable thumb portion overlay 25 sits atop the first ply 20$x$ which as previously explained may make up the bar code scanner attachment portion 22 and the trigger attachment portion 26. Attachment portion 30 may be an extension region 30$y$ of the second ply of material 20$y$ previously described. Alternatively, attachment portion 30 may be a separate ply of material secured to the second ply of material 20$y$ by adhesive, sonic welding, stitching or other securement means. Attachment portion 30 may be provided with a Velcro® hook (or loop fastener) 30$x$ illustratively adhered along a bottom of attachment portion 30 and configured to secure the attachment portion 30 to a Velcro® loop (or hook) fastener 25$y$ located along front side 20 of the hand wearable support 10. Contour lines (not shown) (like elevations, depressions, score lines, and so on across the surface of the attachment portion 30) may be provided to better shape the attachment portion 30 for wrapping around the hand of an operator. A label 30$z$ may be provided to display a logo and/or some information like information about the support.

Turning to FIG. 3E, shown is a perspective depiction of cross section 3E-3E depicted in FIG. 2C of the back side 20 of the hand wearable support 10 depicted in FIG. 2C. Attachment portion 30 may be provided with a Velcro® hook (or loop fastener) 30$x$ illustratively adhered along a bottom of attachment portion 30 and configured to secure the attachment portion 30 to a Velcro® loop (or hook) fastener 25$y$ located along front side 20 of the hand wearable support 10. Contour lines 30$z$ (not shown) (like elevations, depressions, score lines, and so on across the surface of the attachment portion 30) may be provided to better shape the attachment portion 30 for wrapping around the hand of an operator. A label 30$z$ may be provided to display a logo and/or some information like information about the support.

Figure 4A:
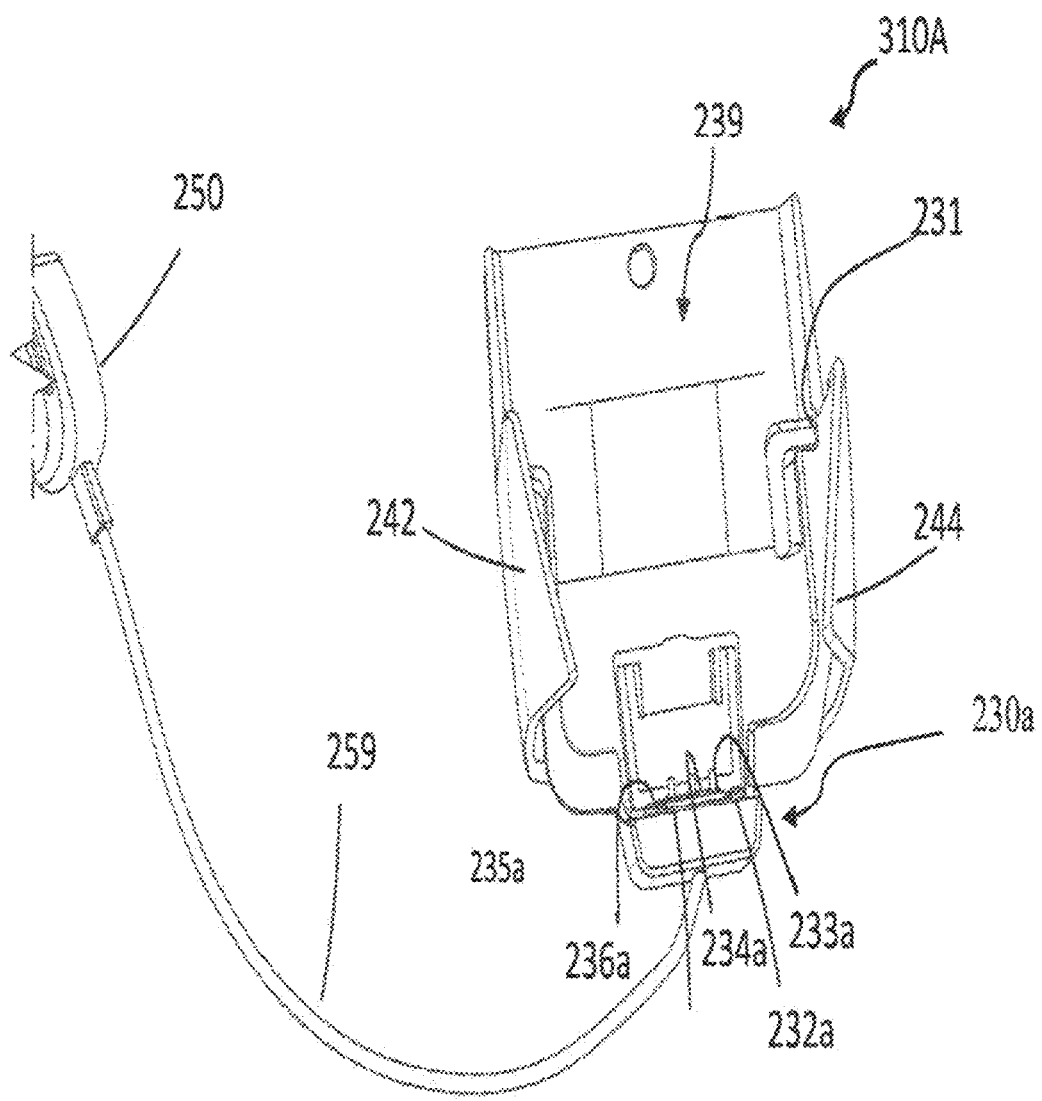
FIGS. 4A, 4B, 4C (collectively FIG. 4) depict illustrative barcode scanner attachment device of this disclosure.
Figure 4B:
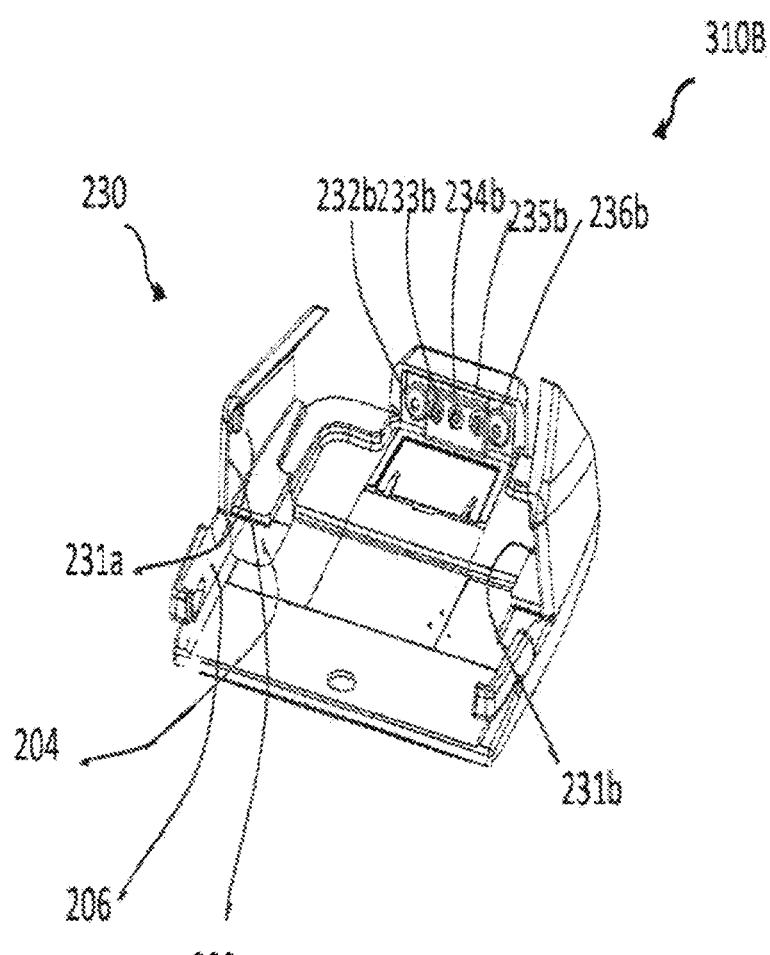
Figure 4C:
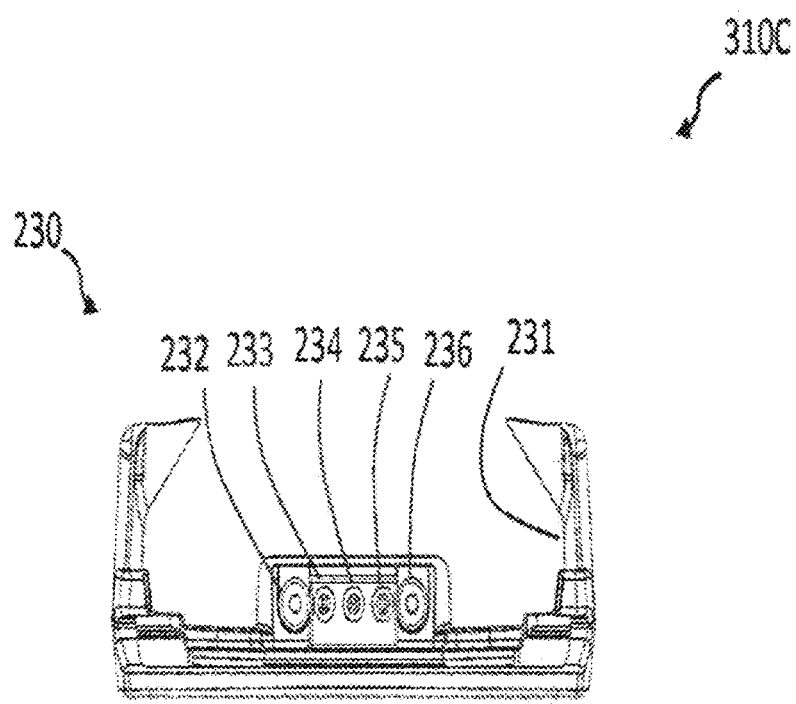

Referring to FIG. 4, the barcode scanner attachment device (310A, 310B, 310C) includes a bottom surface 239, sidewalls 242, 244, and a connector panel 230$a$. The bottom surface 239 and the sidewalls 242, 244 are configured to receive and releasably hold a barcode scanner. More specifically, the bottom surface 239 provides a support platform for receiving a bottom of the barcode scanner and holding the barcode scanner to the wearable of this disclosure. The inside surface 231a, 231b of the sidewalls 242, 244 provide a friction fit for securely holding sidewalls of a barcode scanner that is slipped into the opening of the barcode scanner attachment device formed by the bottom surface 239 and sidewalls 242, 244.

The connector panel 230a include electrical ports sufficient for providing the electrical connectivity between the scanner on the scanner side of the connector panel and the components on the other side of the connector panel, such as, the trigger device 250, port 233 no connection, port 234 ground (gnd), port 235 trigger.

Adhesive material may be applied to a bottom surface of the barcode scanner attachment device to adhere the barcode scanning device to the wearable 20. Alternate means for securing a barcode scanner attachment device to a wearable like Velcro may also be used. The securement of a barcode scanner attachment device to a wearable is a design choice well known to those skilled in the art.

Figure 5A:
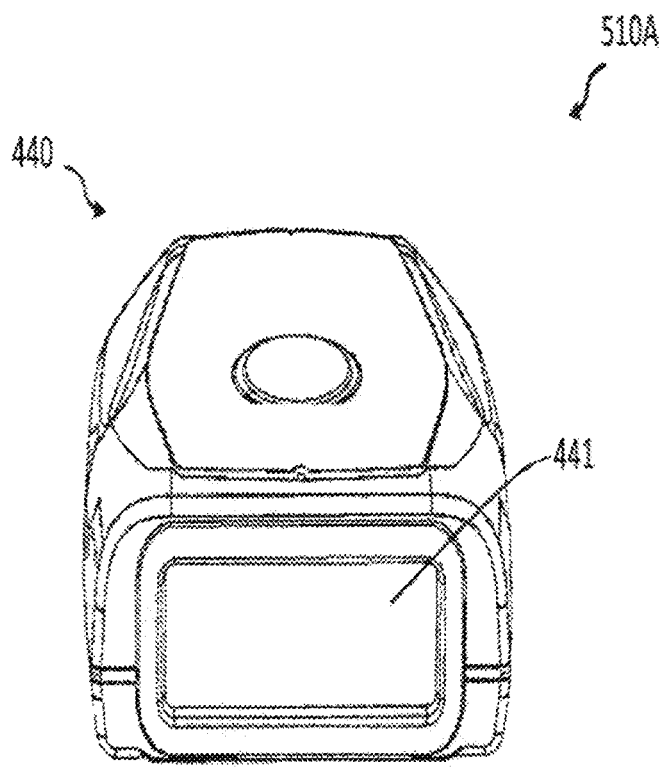
FIGS. 5A, 5B, 5C (collectively FIG. 5) depict illustrative barcode scanner useable in the hand wearable of this disclosure.

Referring to FIG. 5, the barcode scanner 440 includes a scanner window 441, sidewalls 442, and a control panel 440. Inside the barcode scanner 510A is a scan engine (not shown). The scanner window 441 provides a transparent panel through which a beam of light generated by the barcode scanner may pass to and from a barcode to read the barcode.

The sidewalls 442 (only one is shown but the other side is typically similar) are received by the sidewalls 242, 244 of the barcode scanner attachment device which hold the barcode scanner to the barcode scanner attachment device as previously explained. As depicted in FIG. 5C, the sidewall 442 may be provided with an inner wall 445, a partial outer wall 443 and stop 444. The partial outer wall 443 slides along a slot 204 provided in the barcode scanner attachment device, the inner wall 445 slides along an inner wall 208 of the barcode scanner attachment device, and stop 444 comes to a stop at edge 208 to provide a tighter engagement between the barcode scanner and the barcode scanner attachment device.

Figure 5B:
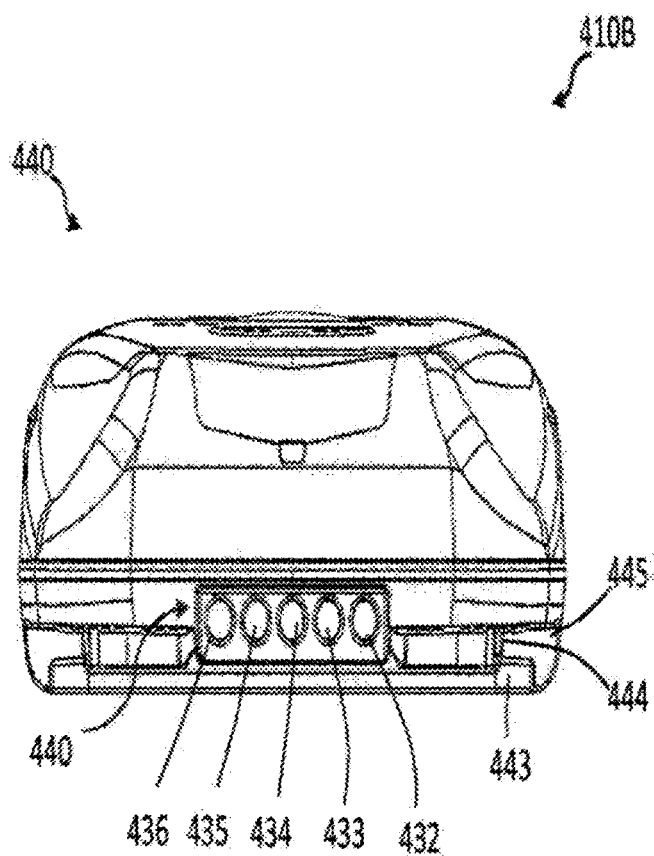
Figure 5C:
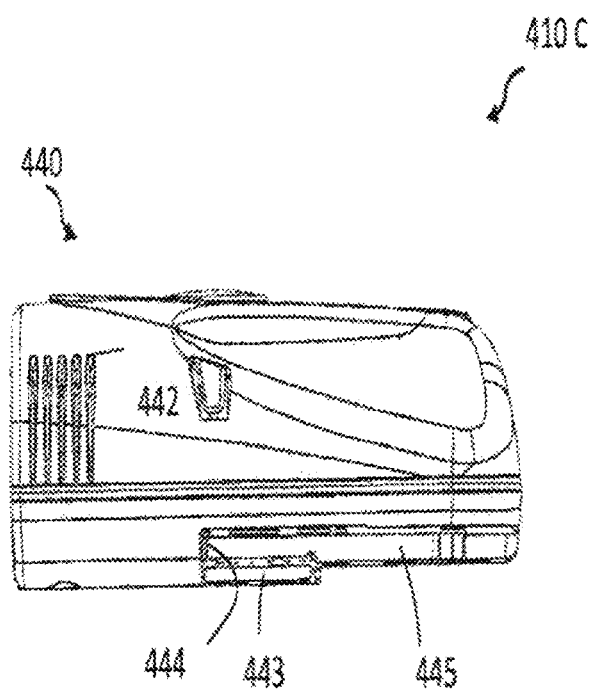

Referring to FIG. 5B port 433 of the barcode scanner is not connected. Port 434 of the barcode scanner is connected with ground 234 of the barcode scanner attachment device. Port 435 of the barcode scanner is connected with trigger port 235 of the barcode scanner attachment device.

FIG. 6A depicts a threading of a tongue portion of a strap attachment portion of a front side of a hand wearable support through a buckle on a back of the hand side of the hand wearable support of this disclosure; and FIG. 6B depicts a means for securing the front side of to the back side of the hand wearable support of this disclosure. FIGS. 6A and 6B herein collectively FIG. 6. In FIG. 6, a Velcro® hook (or loop fastener) 46z illustratively adhered along a bottom of the tongue portion (in this case of the second strap attachment portion 27b and not the first strap attachment portion 27a referred in FIG. 3B) to secure the tongue portion 46b to a Velcro® loop (or hook) fastener 46z' adhered along a mid-section of second harness strap 47b after the tongue portion 46b has been threaded through the buckle 29b to secure the front side 40 to the back side 20 of the hand wearable support 10 as herein explained.

Figure 7A:
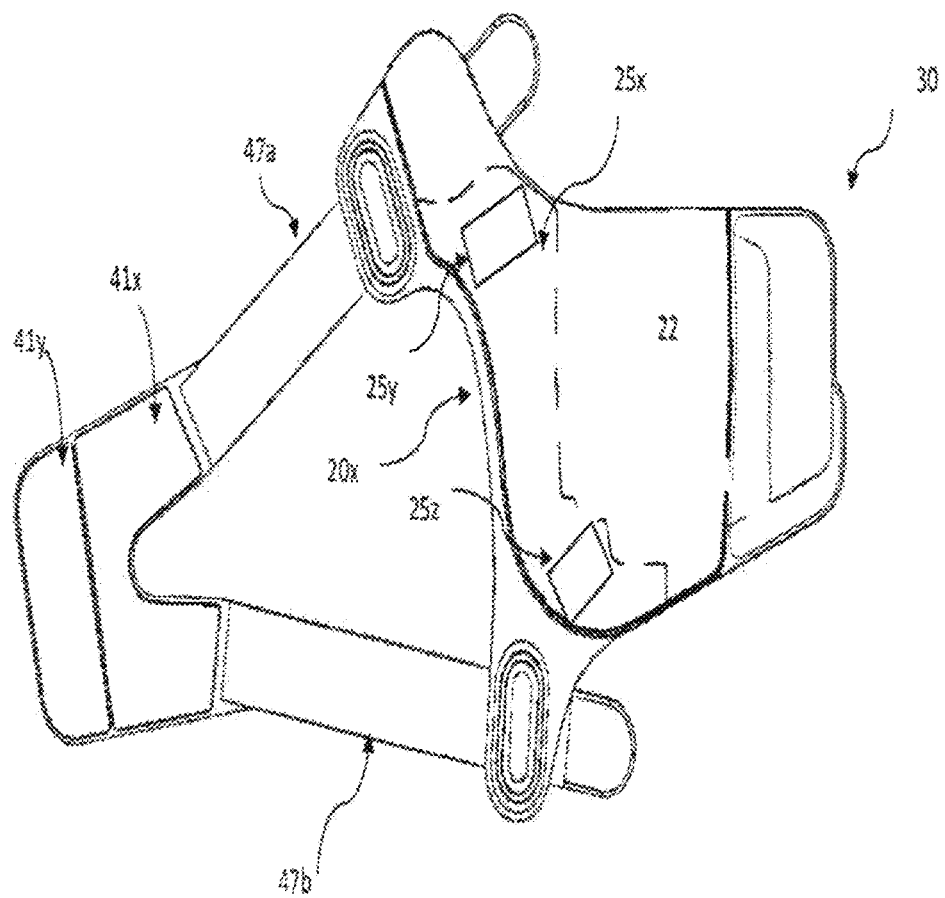
FIG. 7A depicts the hand wearable support 10 for a bar code scanner shown in FIG. 1 with releasable thumb portion overlay 25 removed.
Figure 7B:
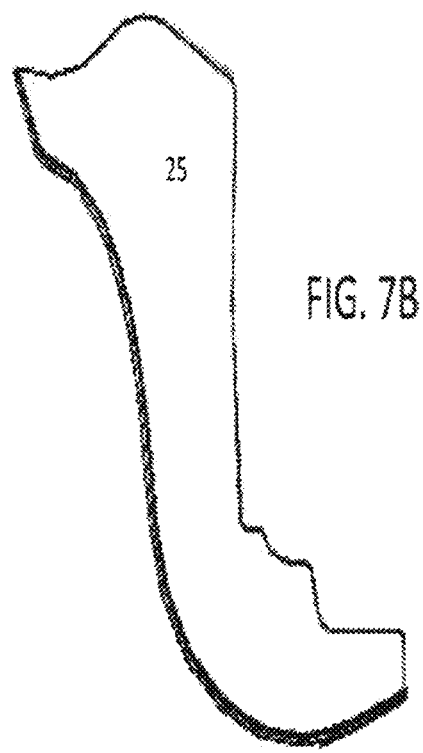
FIGS. 7B and 7C depict top and bottom views, respectively, of the removed releasable thumb portion overlay 25.
Figure 7C:
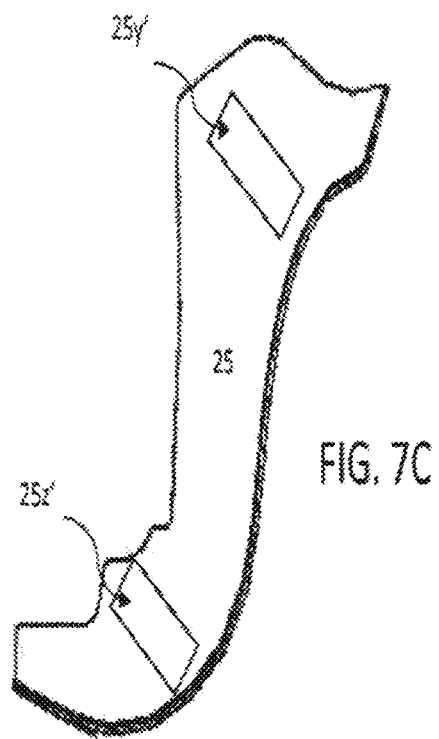
Figure 8B:
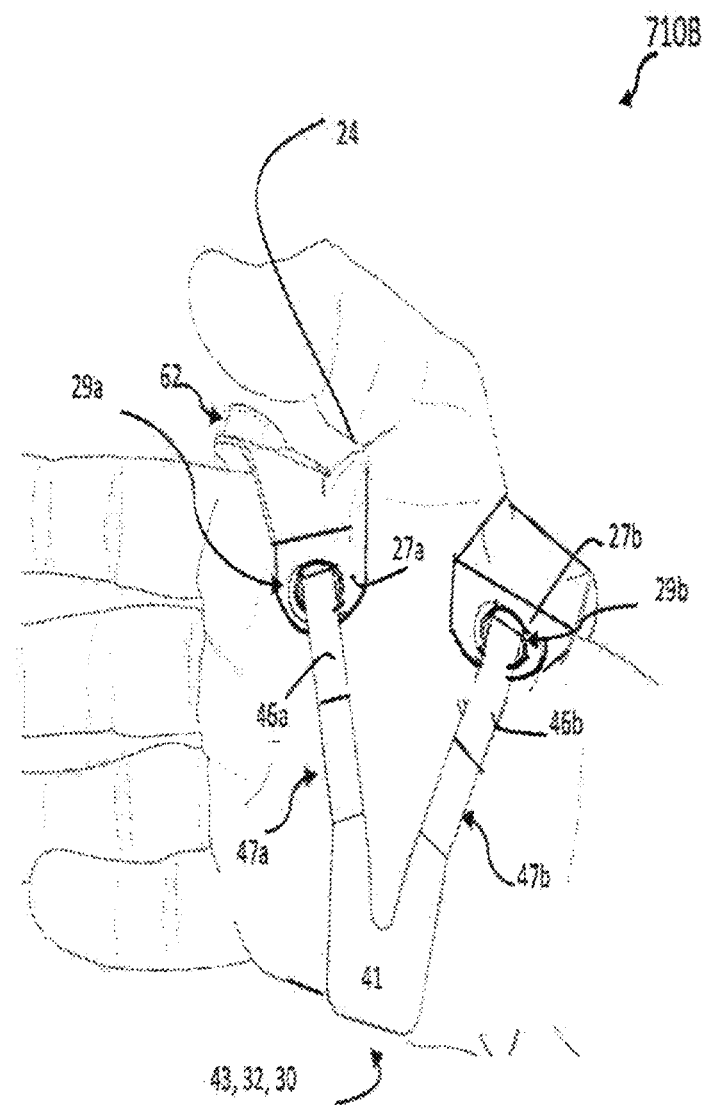

FIG. 7A depicts the hand wearable support 10 for a bar code scanner shown in FIG. 1 with releasable thumb portion overlay 25 removed; and FIGS. 7B and 7C depict top and bottom views, respectively, of the removed releasable thumb portion overlay 25. FIGS. 7A, 7B, and 7C herein collectively FIG. 7. As shown in FIG. 7, a pair of Velcro® hook (or loop fastener) 25y, 25z illustratively adhered along opposing ends of the first single ply of material 20x (previously explained) to a Velcro® loop (or hook) fastener 25y, 25z adhered along opposing ends of releasable thumb portion overlay 25 secure the releasable thumb portion overlay 25 to the back side 20 of the hand wearable support 10 as herein explained. FIGS. 8A and 8B depict top and bottom views, respectively, of the hand wearable support 10 assembled with bar code scanner attachment portion and bar code scanner. FIGS. 8A, 8B, and 8C herein collectively FIG. 8 depict hand wearable support assembly 710A of this disclosure. In FIG. 8A is shown a trigger device 650, a bar code scanner 640 held to a back side 624 of the hand wearable support of this disclosure by bar code scanner attachment 630. In FIG. 8B is shown a V-member 41, a first harness strap and a second harness strap 47a, 47b attached thereto extending away from each other at an angle and attached to the back side of the hand wearable support of this disclosure through first and second buckle 27a, 27b on first and second strap attachment portions 27a, 27b as herein disclosed. The releasably attaching the folded back tongue portion 46a of the first harness strap 4747a to the first harness strap 47a, releasably attaching the folded back tongue portion 46b of the second harness strap 47b to the second harness strap 47b, and releasably attaching the means 43 along the V-member 41 to the means 32 for releasably along the attachment portion 30 for attaching to the front side 40 of the hand wearable support 10 forms the hand wearable support 10 configurable for scanning operations.

Figure 9A:
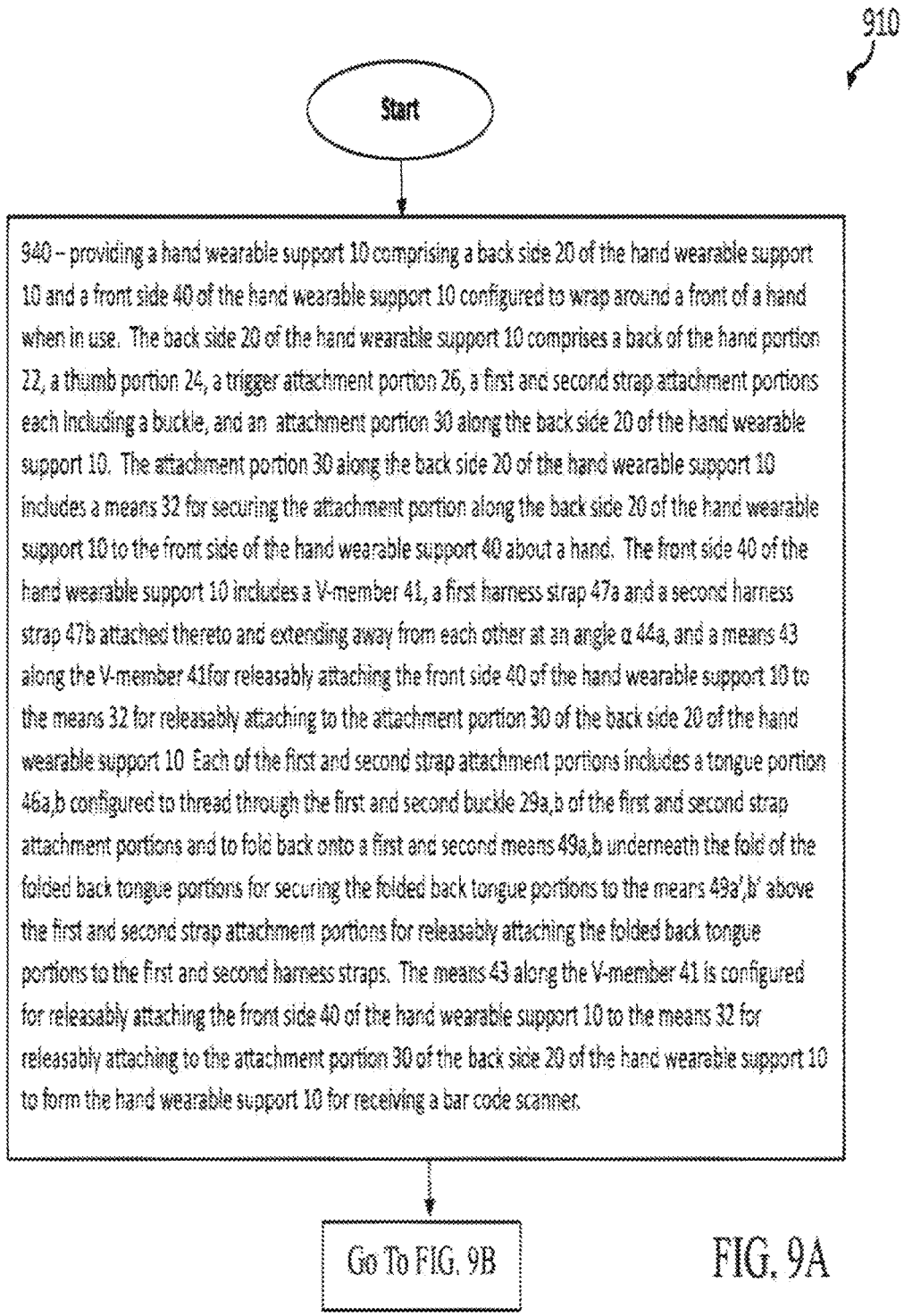
FIGS. 9A and 9B depict illustrative method of hand wearable bar code reading.
Figure 9B:
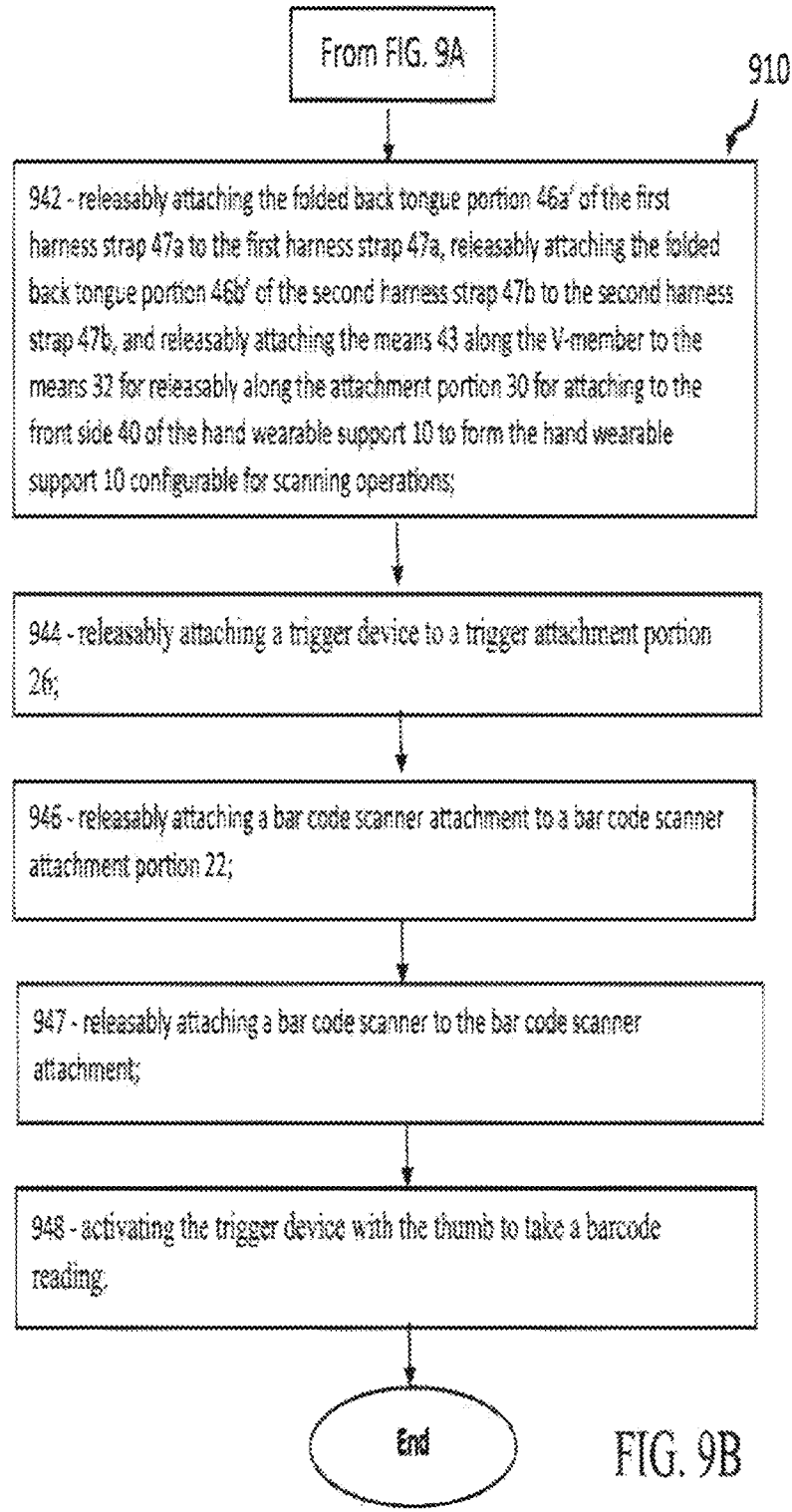

FIGS. 9A and 9B depict illustrative method 910 of hand wearable bar code reading.

At step 940, the method provides a hand wearable support 10 comprising a back side 20 of the hand wearable support 10 and a front side 40 of the hand wearable support 10 configured to wrap around a front of a hand when in use. The back side 20 of the hand wearable support 10 comprises a back of the hand portion 22, a thumb portion 24, a trigger attachment portion 26, a first and second strap attachment portions each including a buckle, and an attachment portion 30 along the back side 20 of the hand wearable support 10. The attachment portion 30 along the back side 20 of the hand wearable support 10 includes a means 32 for securing the attachment portion along the back side 20 of the hand wearable support 10 to the front side of the hand wearable support 40 about a hand. The front side 40 of the hand wearable support 10 includes a V-member 41, a first harness strap 4747a and a second harness strap 47b attached thereto and extending away from each other at an angle α 44a, and a means 43 along the V-member 41 for releasably attaching the front side 40 of the hand wearable support 10 to the means 32 for releasably attaching to the attachment portion 30 of the back side 20 of the hand wearable support 10 Each of the first and second strap attachment portions includes a tongue portion 46a,b configured to thread through the first and second buckle 29ab of the first and second strap attachment portions and to fold back onto a first and second means 49a,b underneath the fold of the folded back tongue portions for securing the folded back tongue portions to the means 49a',b' above the first and second strap attachment portions for releasably attaching the folded back tongue portions to the first and second harness straps. The means 43 along the V-member 41 is configured for releasably attaching the front side 40 of the hand wearable support 10 to the means 32 for releasably attaching to the attachment portion 30 of the back side 20 of the hand wearable support 10 to form the hand wearable support 10 for receiving a bar code scanner.

At step 942, the method releasably attaches the folded back tongue portion 46a' of the first harness strap 47a to the first harness strap 47a, releasably attaching the folded back tongue portion 46b' of the second harness strap 47b to the second harness strap 47b, and releasably attaching the means 43 along the V-member to the means 32 for releasably along the attachment portion 30 for attaching to the front side 40 of the hand wearable support 10 to form the hand wearable support 10 configurable for scanning operations.

At step 944, the method releasably attaches a trigger device to trigger attachment portion 26.

At step 946, the method releasably attaches a bar code scanner attachment to a bar code scanner attachment portion 22.

At step 947, the method releasably attaches a bar code scanner to the bar code scanner attachment.

At step 947, the activation of the trigger device with the thumb causes the barcode scanner to take a barcode.

Figure 10A:
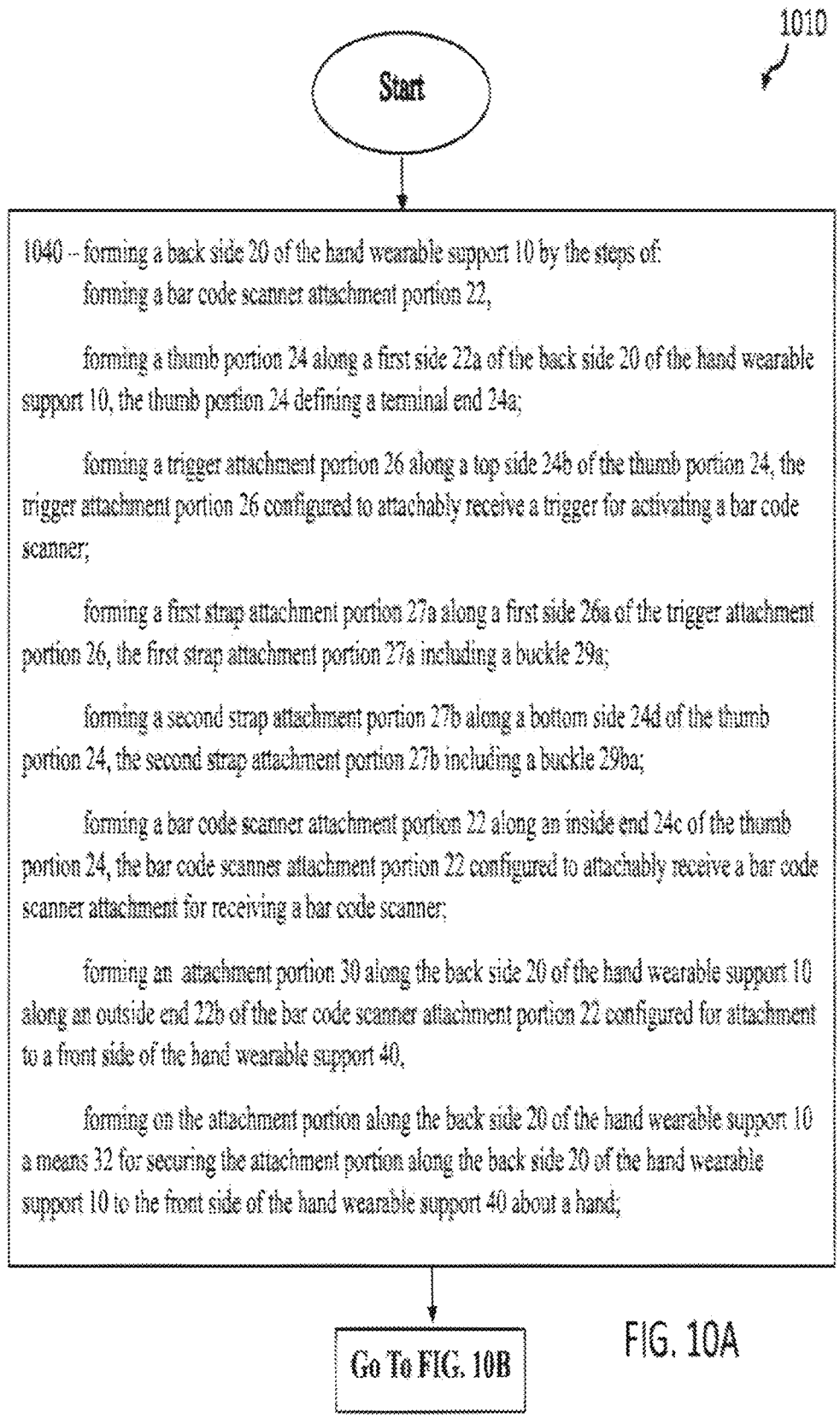
Figure 10C:
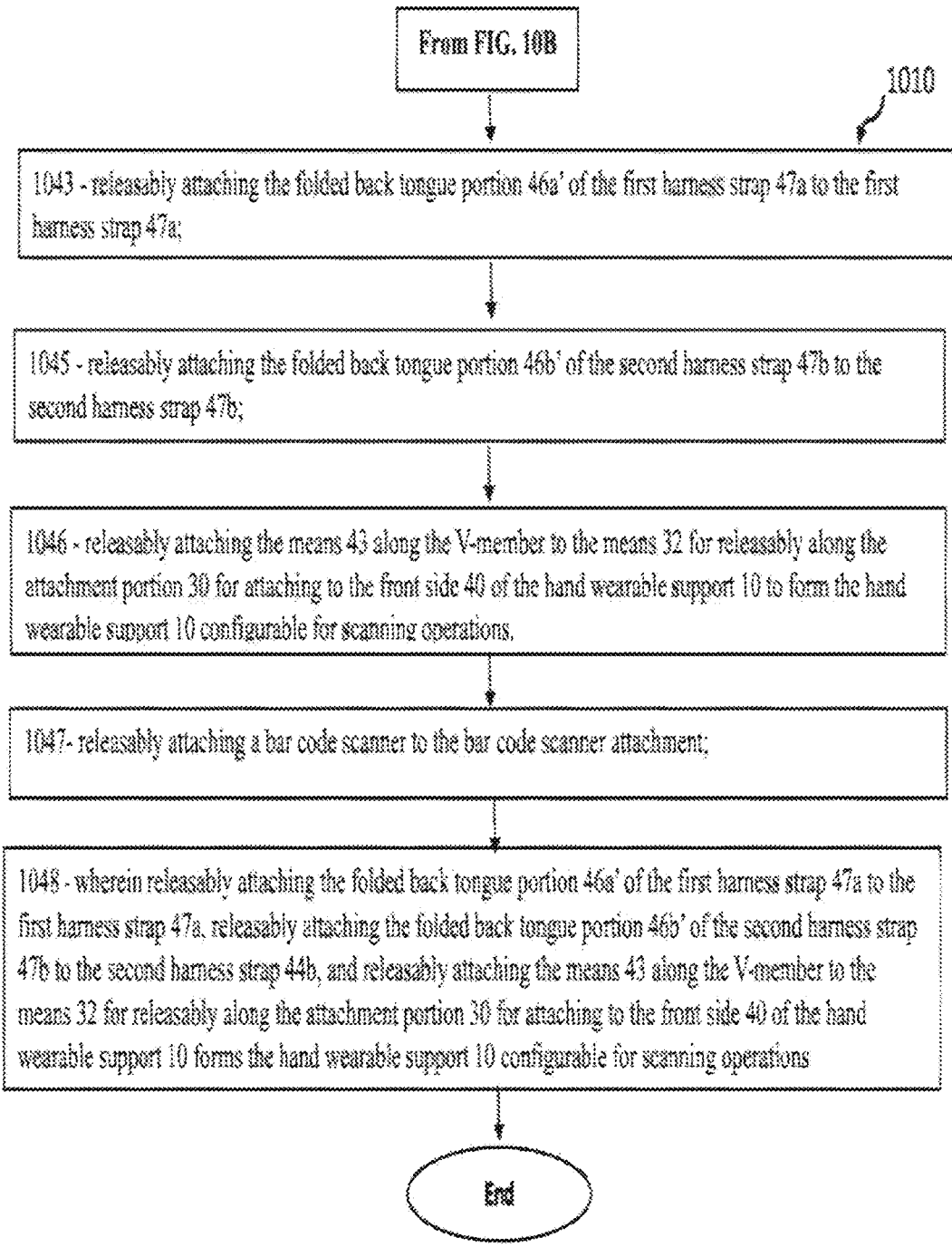

FIGS. 10A, 10B, 10C depict illustrative method 1010 for manufacturing a hand wearable support 10 for a bar code scanner. FIGS. 10A, 10B, and 10C herein collectively FIG. 10.

At step 1040, the method provides forming a back side 20 of the hand wearable support 10 by the steps of:
  forming a bar code scanner attachment portion 22,
    forming a thumb portion 24 along a first side 22a of the back side 20 of the hand wearable support 10, the thumb portion 24 defining a terminal end 24a;
    forming a trigger attachment portion 26 along a top side 24b of the thumb portion 24, the trigger attachment portion 26 configured to attachably receive a trigger for activating a bar code scanner;
    forming a first strap attachment portion 27a along a first side 26a of the trigger attachment portion 26, the first strap attachment portion 27a including a buckle 29a;
    forming a second strap attachment portion 27b along a bottom side 24d of the thumb portion 24, the second strap attachment portion 27b including a buckle 29ba;
    forming a bar code scanner attachment portion 22 along an inside end 24c of the thumb portion 24, the bar code scanner attachment portion 22 configured to attachably receive a bar code scanner attachment for receiving a bar code scanner;
    forming an attachment portion 30 along the back side 20 of the hand wearable support 10 along an outside end 22b of the bar code scanner attachment portion 22 configured for attachment to a front side of the hand wearable support 40,
    forming on the attachment portion along the back side 20 of the hand wearable support 10 a means 32 for securing the attachment portion along the back side 20 of the hand wearable support 10 to the front side of the hand wearable support 40 about a hand;
At step, 1042, the method provides forming a front side 40 of the hand wearable support 10 by the steps of:
  forming a V-member 41, the V-member 41 including a terminal body end 42, a the terminal second arm end 44b extending away from the terminal body end 41 and forming an angle α 44a between the terminal first arm end 44a and the terminal second arm end 44b;
  forming a first harness strap 47a, the first harness strap 47a extending from the terminal first arm end 44a of the V-member 41, the first harness strap 47a including a tongue portion 46a, the tongue portion 46a of the first harness strap 47a configured to thread through buckle 29a of the first strap attachment portion 27a and to fold back onto the first harness strap 47a to form a folded back tongue portion 46a', the folded back tongue portion 46a' of the first harness strap 47a including a means 49a underneath the fold of the folded back tongue portion 46a' for securing the folded back tongue portion 46a' of the first harness strap 44a to a means 49a' above the first harness strap 47a for releasably attaching the folded back tongue portion 46a' to the first harness strap 47a;
  forming a second harness strap 47b, the second harness strap 47b extending from the terminal first arm end 44b of the V-member 41, the second harness strap 47b including a tongue portion 46b, the tongue portion 46b of the first harness strap 47a configured to thread through buckle 29b of the second strap attachment portion 27b and to fold back onto the second harness strap 47b to form a folded back tongue portion 46b', the folded back tongue portion 46b' of the second harness strap 47b including a means 49b underneath the fold of the folded back tongue portion 46b' for securing the folded back tongue portion 46b' of the second harness strap 47b to a means 49b' above the second harness strap 47b for releasably attaching the folded back tongue portion 46b' to the second harness strap 47a;
  forming means 43 along the V-member 41 for releasably attaching the front side 40 of the hand wearable support 10 to the means 32 for releasably attaching to the attachment portion 30 of the back side 20 of the hand wearable support 10 to form the hand wearable support 10 for a bar code scanner;

At step 1043, the method provides releasably attaching the folded back tongue portion 46a' of the first harness strap 47a to the first harness strap 47a.

At 1045, the method provides releasably attaching the folded back tongue portion 46b' of the second harness strap 47b to the second harness strap 47b.

At step 1046, the method provides releasably attaching the means 43 along the V-member to the means 32 for releasably along the attachment portion 30 for attaching to the front side 40 of the hand wearable support 10 to form the hand wearable support 10 configurable for scanning operations.

At step 1047, the method provides releasably attaching a bar code scanner to the bar code scanner attachment.

At step 1047, the method provides wherein releasably attaching the folded back tongue portion 46a' of the first harness strap 47a to the first harness strap 47a, releasably attaching the folded back tongue portion 46b' of the second harness strap 47b to the second harness strap 47b, and releasably attaching the means 43 along the V-member to the means 32 for releasably along the attachment portion 30 for attaching to the front side 40 of the hand wearable support 10 forms the hand wearable support 10 configurable for scanning operations.

Figure 11A:
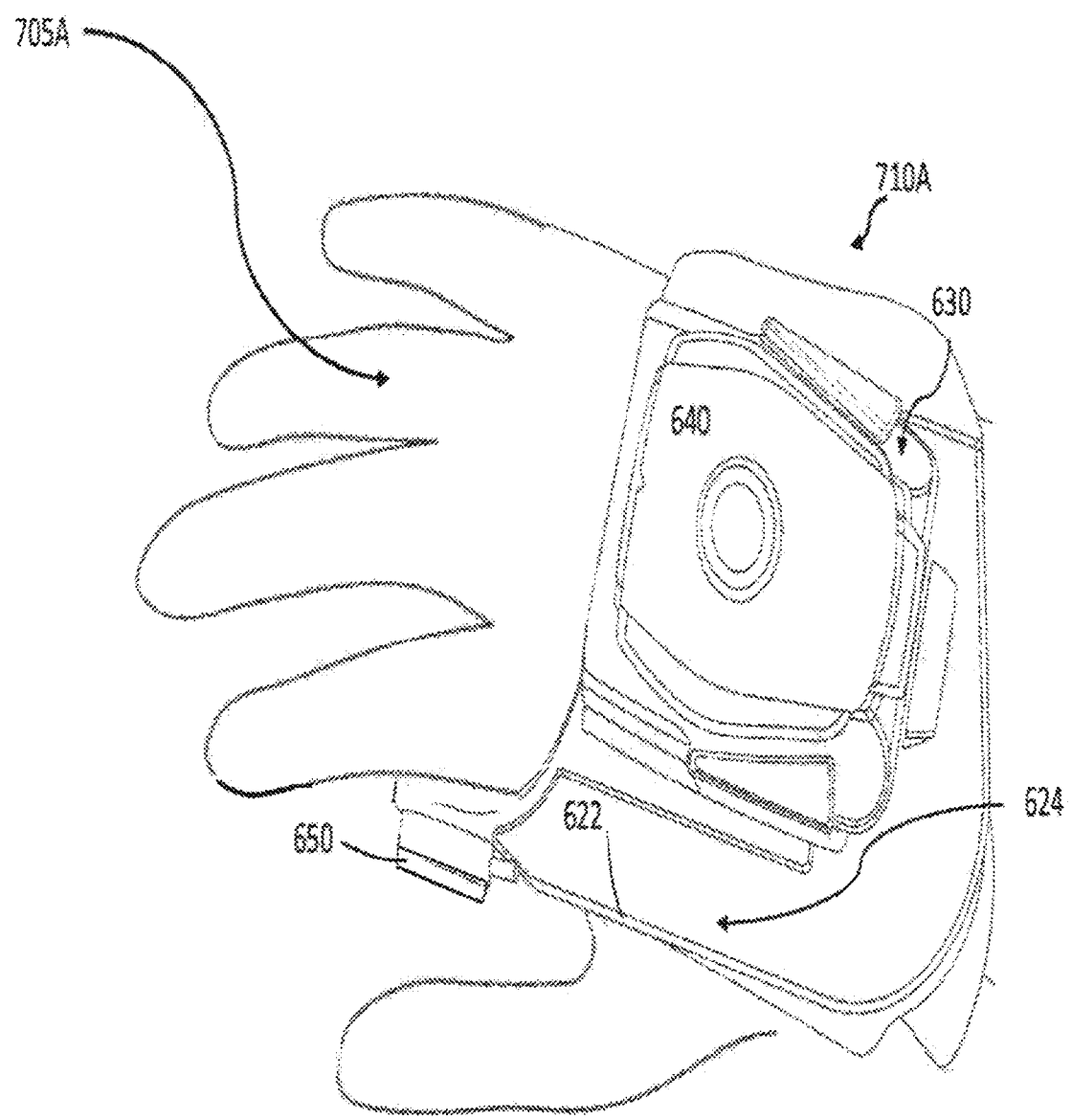
FIGS. 11A and 11B depict top and bottom views, respectively, of the hand wearable support 10 assembled with bar code scanner attachment portion and bar code scanner, the hand wearable support 10 as worn over a glove.
Figure 11B:
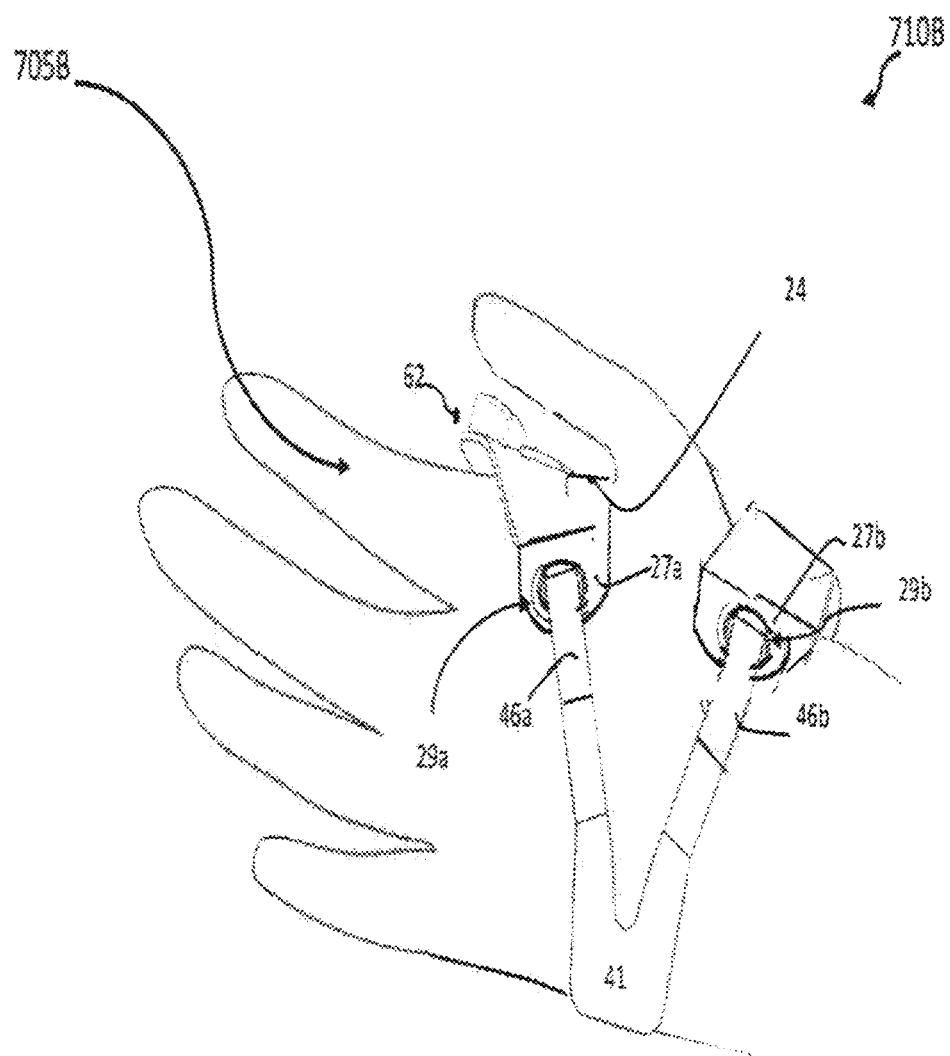

FIGS. 11A and 11B depict top and bottom views, respectively, of the hand wearable support 10 assembled with bar code scanner attachment portion and bar code scanner, the hand wearable support 10 shown worn over a glove. FIGS. 11A and 11B herein collectively FIG. 11. The elements shown in FIG. 11 bear the same numbers and have the same functionality as like numbered parts depicted in FIG. 8 and the disclosure of those elements there apply to the disclosure of those elements in FIG. 11. FIG. 11A further depicts a glove 705A and FIG. 11B further depicts a glove 705B.

As FIG. 11 evidences, the hand wearable support herein disclosed may fit over a glove with FIG. 11 showing a top 705A of the glove in FIG. 11A and a bottom 705B of the glove in FIG. 11B.

For instance, the hand wearable support could be affixed to a glove by any of the attachment means herein disclosed (like Velcro® or other fasteners) to provide a unitary hand wearable in the form factor of a glove. As another example, the hand wearable support could be provided with a flexible, stretchable layer of material like a flexible polyester between straps 47a, 47b. As another example the wearable support could be worn over a glove without any additional attachment means coupling the wearable support and the glove.

There is thus disclosed is a hand wearable support 10 for a bar code scanner. The hand wearable support 10 comprises a back side 20 of the hand wearable support 10 configured to wrap around a back of a hand and a front side 40 of the hand wearable support 10 configured to wrap around a front of a hand when in use.

The back side 20 of the hand wearable support 10 may include a bar code scanner attachment portion 22, a thumb portion 24, a trigger attachment portion 26, a first and second strap attachment portions each including a buckle, and an attachment portion 30 along the back side 20 of the hand wearable support 10.

The attachment portion 30 along the back side 20 of the hand wearable support 10 may include a means 32 for securing the attachment portion along the back side 20 of the hand wearable support 10 to the front side of the hand wearable support 40 about a hand;

The front side 40 of the hand wearable support 10 may include a V-member 41, a first harness strap 47a and a second harness strap 47b attached thereto and extending away from each other at an angle α 44a, and a means 43 along the V-member 41 for releasably attaching the front side 40 of the hand wearable support 10 to the means 32 for releasably attaching to the attachment portion 30 of the back side 20 of the hand wearable support 10.

Each of the first and second harness strap portions may include a tongue portion 46a,b configured to thread through the first and second buckle 29a,b of the first and second strap attachment portions and to fold back onto a first and second means 49a,b underneath the fold of the folded back tongue portions for securing the folded back tongue portions to the means 49a',b' above the first and second strap attachment portions for releasably attaching the folded back tongue portions to the first and second harness straps.

The means 43 along the V-member 41 may be configured for releasably attaching the front side 40 of the hand wearable support 10 to the means 32 for releasably attaching to the attachment portion 30 of the back side 20 of the hand wearable support 10 to form the hand wearable support 10 for receiving a bar code scanner.

The releasably attaching the folded back tongue portion 46a' of the first harness strap 47a to the first harness strap 47a, releasably attaching the folded back tongue portion 46b' of the second harness strap 47b to the second harness strap 47b, and releasably attaching the means 43 along the V-member to the means 32 for releasably along the attachment portion 30 for attaching to the front side 40 of the hand wearable support 10 forms the hand wearable support 10 configurable for scanning operations.

The hand wearable support 10 for a bar code scanner may be used in combination with a trigger device. The trigger device may be releasably attached to the trigger attachment portion 26.

The hand wearable support 10 for a bar code scanner may be used in combination with a bar code scanner attachment for receiving a bar code scanner. The bar code scanner attachment is releasably attached to the bar code scanner attachment portion 22.

The hand wearable support 10 for a bar code scanner may be used in combination with a bar code scanner, The bar code scanner may be releasably attached to the bar code scanner attachment portion 22.

The hand wearable support 10 for a bar code scanner may be used in combination with a trigger device. The trigger device may be releasably attached to the trigger attachment portion 26. The trigger device may be electrically connected to the bar code scanner. The activation of the trigger device applies an electrical signal to the bar code scanner.

The hand wearable support 10 for a bar code scanner may further include a wire. The wire may extend from the trigger device to the bar code scanner. The electrical signal applied to the bar code scanner from the trigger device may be carried along the wire extending from the trigger device to the bar code scanner, The back side 20 of the hand wearable support 10 further comprises a releasable thumb portion overlay 25, the releasable thumb portion overlay configured to overlay a wire tethering the trigger to the bar code scanner;

The hand wearable support 10 for a bar code scanner may be used in combination with a trigger device, a bar code scanner attachment, and a bar code scanner. The trigger device may be releasably attached to the trigger attachment portion 26. The bar code scanner attachment may be releasably attached to the bar code scanner attachment portion 22. The bar code scanner may be releasably attached to the bar code scanner attachment portion 22. The combination forms a bar code scanner assembly in the form factor of a support for wear by a user to perform scanning operations.

In another aspect, a hand wearable support 10 for a bar code scanner may include a back side 20 of the hand wearable support 10. The back side 20 may be configured to wrap around the back of a hand when in use. The back side 20 may include a bar code scanner attachment portion 22; a thumb portion 24; a trigger attachment portion 26; a releasable thumb portion overlay 25; a first strap attachment portion 27a; a second strap attachment portion 27b; an attachment portion 30.

The thumb portion 24 may run along a first side 22a of the back side 20 of the hand wearable support 10. The thumb portion 24 defining a terminal end 24a.

The trigger attachment portion 26 may run along a top side 24b of the thumb portion 24. The trigger attachment portion 26 may be configured to attachably receive a trigger for activating a bar code scanner.

The releasable thumb portion overlay 25 may be configured to overlay a wire between the trigger to the bar code scanner for carrying electrical signals generated by the trigger to the bar code scanner.

The first strap attachment portion 27a may run along a first side 26a of the trigger attachment portion 26, the first strap attachment portion 27a including a buckle 29a.

The second strap attachment portion 27b may run along a bottom side 24d of the thumb portion 24. The second strap attachment portion 27b may include a buckle 29ba.

The bar code scanner attachment portion 22 may run along an inside end 24c of the thumb portion 24 and configured to attachably receive a bar code scanner attachment for receiving a bar code scanner.

The attachment portion 30 along the back side 20 of the hand wearable support 10 may be configured for attachment to a front side of the hand wearable support 40. The attachment portion along the back side 20 of the hand wearable support 10 may run along an outside end 22b of the bar code scanner attachment portion 22. The attachment portion along the back side 20 of the hand wearable support 10 may include a means 32 along the back side 20 of the hand wearable support 10 for securing the attachment portion along the back side 20 of the hand wearable support 10 to the front side of the hand wearable support 40 about a hand.

The front side 40 of the hand wearable support 10 may be configured to wrap around a front of a hand when in use. The front side 40 of the hand wearable support 10 may include: a V-member 41; a first harness strap 47a; a second harness strap 47b; means 43 along the V-member 41 for releasably attaching the front side 40 of the hand wearable support 10 to the means 32 for releasably attaching to the attachment portion 30 of the back side 20 of the hand.

The V-member 41 may include a terminal body end 42, a terminal first arm end 44a, a terminal second arm end 44b, the terminal first arm end 44a and the terminal second arm end 44b extending away from the terminal body end 41 and forming an angle α 44a between the terminal first arm end 44a and the terminal second arm end 44b.

The first harness strap 47a may extend from the terminal first arm end 44a of the V-member 41. The first harness strap 47a may include a tongue portion 46a. The tongue portion 46a of the first harness strap 47a may be configured to thread through buckle 29a of the first strap attachment portion 27a and to fold back onto the first harness strap 47a to form a folded back tongue portion 46a'. The folded back tongue portion 46a' of the first harness strap 47a may include a means 49a underneath the fold of the folded back tongue portion 46a' for securing the folded back tongue portion 46a' of the first harness strap 47a to a means 49a' above the first harness strap 47a for releasably attaching the folded back tongue portion 46a' to the first harness strap 47a.

The second harness strap 44b, the second harness strap 47b may extend from the terminal first arm end 44b of the V-member 41, the second harness strap 47b may include a tongue portion 46b. The tongue portion 46b of the first harness strap 47a may be configured to thread through buckle 29b of the second strap attachment portion 27b and to fold back onto the second harness strap 47b to form a folded back tongue portion 46b'. The folded back tongue portion 46b' of the second harness strap 47b may include a means 49b underneath the fold of the folded back tongue portion 46b' for securing the folded back tongue portion 46b' of the second harness strap 47b to a means 49b' above the second harness strap 47b for releasably attaching the folded back tongue portion 46b' to the second harness strap 47b.

The means 43 along the V-member 41 for releasably attaching the front side 40 of the hand wearable support 10 to the means 32 for releasably attaching to the attachment portion 30 of the back side 20 of the hand wearable support 10 to form the hand wearable support 10 for a bar code scanner.

Releasably attaching the folded back tongue portion 46a' of the first harness strap 47a to the first harness strap 47a, releasably attaching the folded back tongue portion 46b' of the second harness strap 47b to the second harness strap 47b, and releasably attaching the means 43 along the V-member to the means 32 for releasably along the attachment portion 30 for attaching to the front side 40 of the hand wearable support 10 forms the hand wearable support 10 configurable for scanning operations.

The hand wearable support 10 for a bar code scanner may be used in combination with a trigger device. The trigger device may be releasably attached to the trigger attachment portion 26.

The hand wearable support 10 for a bar code scanner may be used in combination with a bar code scanner attachment for receiving a bar code scanner. The bar code scanner attachment may be releasably attached to the bar code scanner attachment portion 22.

The hand wearable support 10 for a bar code scanner may be used in combination with a bar code scanner. The bar code scanner may be releasably attached to the bar code scanner attachment portion 22.

The hand wearable support 10 for a bar code scanner may be used in combination with a trigger device. The trigger device may be releasably attached to the trigger attachment portion 26. The trigger device may be electrically connected to the bar code scanner. Activation of the trigger device applies an electrical signal to the bar code scanner.

The means 49a underneath the fold of the folded back tongue portion 46a' of the first harness strap 47a for securing the folded back tongue portion 46a' of the first harness strap 47a to the first harness strap 47a may be either a hook or loop Velcro® fastener. The means 49a' above the first harness strap 47a for releasably attaching the folded back tongue portion 46a' of the first harness strap 47a to the first harness strap 47a may be a loop Velcro® fastener if the means underneath the fold of the folded back tongue portion 46a' of the first harness strap 47a is a hook Velcro® fastener or a hook Velcro® fastener if the means underneath the fold of the folded back tongue portion 46a' of the first harness strap 47a is a loop Velcro® fastener.

The means 49b underneath the fold of the folded back tongue portion 46b' of the second harness strap 47b for securing the folded back tongue portion 46b' of the second harness strap 47b to the second harness strap 47b may be either a hook or loop Velcro® fastener;

The means 49b' above the second harness strap 47b for releasably attaching the folded back tongue portion 46b of the second harness strap 46b to the second harness strap 47b may be a loop Velcro® fastener if the means underneath the fold of the folded back tongue portion 46b' of the second harness strap 47b is a hook Velcro® fastener or a hook Velcro® fastener if the means underneath the fold of the folded back tongue portion 46b' of the second harness strap 47b is a loop Velcro® fastener.

The means 32 along the back side 20 of the hand wearable support 10 for securing the attachment portion along the back side 20 of the hand wearable support 10 to the front side of the hand wearable support 40 may be either a hook or loop Velcro® fastener.

The means 43 along the V-member 41 for releasably attaching the front side 40 of the hand wearable support 10 to the means 32 for releasably attaching to the attachment portion 30 of the back side 20 of the hand wearable support 10 to form the hand wearable support 10 for a bar code scanner may be a loop Velcro® fastener if the means 43 along the V-member 41 for releasably attaching the front side 40 of the hand wearable support 10 to the means 32 for releasably attaching to the attachment portion 30 of the back side 20 of the hand wearable support 10 to form the hand wearable support 10 for a bar code scanner or a hook Velcro® fastener if the means 43 along the V-member 41 for releasably attaching the front side 40 of the hand wearable support 10 to the means 32 for releasably attaching to the attachment portion 30 of the back side 20 of the hand wearable support 10 to form the hand wearable support 10 for a bar code scanner is a loop Velcro® fastener In a method of hand wearable bar code reading, the method may include the steps of: providing a hand wearable support 10 for a bar code scanner comprising: a back side 20 of the hand wearable support 10 configured to wrap around a back of a hand and a front side 40 of the hand wearable support 10 configured to wrap around a front of a hand when in use.

The back side 20 of the hand wearable support 10 may include a bar code scanner attachment portion 22, a thumb portion 24, a trigger attachment portion 26, a first and second strap attachment portions each including a buckle, and an attachment portion 30 along the back side 20 of the hand wearable support 10;

The attachment portion 30 along the back side 20 of the hand wearable support 10 may include a means 32 for securing the attachment portion along the back side 20 of the hand wearable support 10 to the front side of the hand wearable support 40 about a hand.

The front side 40 of the hand wearable support 10 may include a V-member 41, a first harness strap 47a and a second harness strap 47b attached thereto and extending away from each other at an angle α 44a, and a means 43 along the V-member 41 for releasably attaching the front side 40 of the hand wearable support 10 to the means 32 for releasably attaching to the attachment portion 30 of the back side 20 of the hand wearable support 10.

Each of the first and second harness strap portions may include a tongue portion 46a,b configured to thread through the first and second buckle 29a,b of the first and second strap attachment portions and to fold back onto a first and second means 49a,b underneath the fold of the folded back tongue portions for securing the folded back tongue portions to the means 49a',b' above the first and second strap attachment portions for releasably attaching the folded back tongue portions to the first and second harness straps.

The means 43 along the V-member 41 may be configured for releasably attaching the front side 40 of the hand wearable support 10 to the means 32 for releasably attaching to the attachment portion 30 of the back side 20 of the hand wearable support 10 to form the hand wearable support 10 for receiving a bar code scanner.

Releasably attaching the folded back tongue portion 46a' of the first harness strap 47a to the first harness strap 47a, releasably attaching the folded back tongue portion 46b' of the second harness strap 47b to the second harness strap 47b, and releasably attaching the means 43 along the V-member to the means 32 for releasably along the attachment portion 30 for attaching to the front side 40 of the hand wearable support 10 to form the hand wearable support 10 configurable for scanning operations.

Releasably attaching a trigger device to a trigger attachment portion 26.

Releasably attaching a bar code scanner attachment to a bar code scanner attachment portion 22.

Releasably attaching a bar code scanner to the bar code scanner attachment.

Electrically connecting the trigger device to the bar code scanner.

Activating the trigger device with the thumb to take a barcode reading.

The method of hand wearable bar code reading may further include: electrically connecting the trigger device to the bar code scanner via a trigger port of the barcode scanner attachment device.

A method of hand wearable bar code reading may include the steps of: providing a hand wearable support 10 for a bar code scanner, comprising:

The back side 20 may be configured to wrap around the back of a hand when in use, the back side 20 including a bar code attachment portion 22; a thumb portion 24; a trigger attachment portion 26; a first strap attachment portion 27a; a second strap attachment portion 27b; a bar code scanner attachment portion 22: an attachment portion 30 along the back side 20 of the hand wearable support 10;

The thumb portion 24 may run along a first side 22a of the back side 20, the thumb portion 24 defining a terminal end 24a.

The trigger attachment portion 26 may run along a top side 24b of the thumb portion 24. The trigger attachment portion 26 configured to attachably receive a trigger for activating a bar code scanner.

The first strap attachment portion 27a may run along a first side 26a of the trigger attachment portion 26. The first strap attachment portion 27a including a buckle 29a.

The second strap attachment portion 27b may run along a bottom side 24d of the thumb portion 24. The second strap attachment portion 27b including a buckle 29ba.

The bar code scanner attachment portion 22 may run along an inside end 24c of the thumb portion 24. The bar code scanner attachment portion 22 may be configured to attachably receive a bar code scanner attachment for receiving a bar code scanner.

The attachment portion 30 along the back side 20 of the hand wearable support 10 may be configured for attachment to a front side of the hand wearable support 40. The attachment portion along the back side 20 of the hand wearable support 10 may run along an outside end 22b of the bar code scanner attachment portion 22. The attachment portion along the back side 20 of the hand wearable support 10 may include a means 32 along the back side 20 of the hand wearable support 10 for securing the attachment portion along the back side 20 of the hand wearable support 10 to the front side of the hand wearable support 40 about a hand.

The front side 40 of the hand wearable support 10 configured to wrap around a front of a hand when in use, the front side 40 of the hand wearable support 10 including a V-member 41: a first harness strap 47a; a second harness strap 47b; means 43 along the V-member 41 for releasably attaching the front side 40 of the hand wearable support 10 to the means 32 for releasably attaching to the attachment portion 30 of the back side 20 of the hand wearable support 10.

The V-member 41, the V-member 41 including a terminal body end 42, a terminal first arm end 44a, a terminal second arm end 44b, the terminal first arm end 44a and the terminal second arm end 44b extending away from the terminal body end 41 and forming an angle α 44a between the terminal first arm end 44a and the terminal second arm end 44b.

The first harness strap 47a, the first harness strap 47a extending from the terminal first arm end 44a of the V-member 41, the first harness strap 47a including a tongue portion 46a, the tongue portion 46a of the first harness strap 47a configured to thread through buckle 29a of the first strap attachment portion 27a and to fold back onto the first harness strap 47a to form a folded back tongue portion 46a', the folded back tongue portion 46a' of the first harness strap 47a including a means 49a underneath the fold of the folded back tongue portion 47a for securing the folded back tongue portion 46a' of the first harness strap 47a to a means 49a' above the first harness strap 47a for releasably attaching the folded back tongue portion 46a' to the first harness strap 47a.

The second harness strap 44b, the second harness strap 47b extending from the terminal first arm end 44b of the V-member 41, the second harness strap 47b including a tongue portion 46b, the tongue portion 46b of the second harness strap 47b configured to thread through buckle 29b of the second strap attachment portion 27b and to fold back onto the second harness strap 47b to form a folded back tongue portion 46b', the folded back tongue portion 46b' of the second harness strap 47b including a means 49b underneath the fold of the folded back tongue portion 47b for securing the folded back tongue portion 46b' of the second harness strap 47b to a means 49b' above the second harness strap 47b for releasably attaching the folded back tongue portion 46b' to the second harness strap 47b.

The means 43 along the V-member 41 for releasably attaching the front side 40 of the hand wearable support 10 to the means 32 for releasably attaching to the attachment portion 30 of the back side 20 of the hand wearable support 10 to form the hand wearable support 10 for a bar code scanner.

Releasably attaching the folded back tongue portion 46a' of the first harness strap 47a to the first harness strap 47a, releasably attaching the folded back tongue portion 46b' of the second harness strap 47b to the second harness strap 47b, and releasably attaching the means 43 along the V-member to the means 32 for releasably along the attachment portion 30 for attaching to the front side 40 of the hand wearable support 10 to form the hand wearable support 10 configurable for scanning operations.

Releasably attaching a trigger device to a trigger attachment portion 26.

Releasably attaching a bar code scanner attachment to a bar code scanner attachment portion 22.

Releasably attaching a bar code scanner to the bar code scanner attachment.

Electrically connecting the trigger device to the bar code scanner.

Activating the trigger device with the thumb to take a barcode reading.

A method for manufacturing a hand wearable support 10 for a bar code scanner includes the steps of:
forming a back side 20 of the hand wearable support 10 by the steps of:
forming a bar code scanner attachment portion 22;
forming a thumb portion 24 along a first side 22a of the back side 20 of the hand wearable support 10, the thumb portion 24 defining a terminal end 24a;
forming a trigger attachment portion 26 along a top side 24b of the thumb portion 24, the trigger attachment portion 26 configured to attachably receive a trigger for activating a bar code scanner;
forming a first strap attachment portion 27a along a first side 26a of the trigger attachment portion 26, the first strap attachment portion 27a including a buckle 29a;
forming a second strap attachment portion 27b along a bottom side 24d of the thumb portion 24, the second strap attachment portion 27b including a buckle 29ba;
forming a bar code scanner attachment portion 22 along an inside end 24c of the thumb portion 24, the bar code scanner attachment portion 22 configured to attachably receive a bar code scanner attachment for receiving a bar code scanner;
forming an attachment portion 30 along the back side 20 of the hand wearable support 10 along an outside end 22b of the bar code scanner attachment portion 22 configured for attachment to a front side of the hand wearable support 40,
forming on the attachment portion along the back side 20 of the hand wearable support 10 a means 32 for securing the attachment portion along the back side 20 of the hand wearable support 10 to the front side of the hand wearable support 40 about a hand; forming a front side 40 of the hand wearable support 10 by the steps of:
forming a V-member 41, the V-member 41 including a terminal body end 42, a the terminal second arm end 44b extending away from the terminal body end 41 and forming an angle α 44a between the terminal first arm end 44a and the terminal second arm end 44b;
forming a first harness strap 47a, the first harness strap 47a extending from the terminal first arm end 44a of the V-member 41, the first harness strap 47a including a tongue portion 46a, the tongue portion 46a of the first harness strap 47a configured to thread through buckle 29a of the first strap attachment portion 27a and to fold back onto the first harness strap 47a to form a folded back tongue portion 46a', the folded back tongue portion 46a' of the first harness strap 47a including a means 49a underneath the fold of the folded back tongue portion 46a' for securing the folded back tongue portion 46a' of the first harness strap 47a to a means 49a' above the first harness strap 44a for releasably attaching the folded back tongue portion 47a to the first harness strap 47a;
forming a second harness strap 47b, the second harness strap 47b extending from the terminal first arm end 44b of the V-member 41, the second harness strap 47b including a tongue portion 46b, the tongue portion 46b of the second harness strap 47b configured to thread through buckle 29b of the second strap attachment portion 27b and to fold back onto the second harness strap 47b to form a folded back tongue portion 46b', the folded back tongue portion 46b' of the second harness strap 47b including a means 49b underneath the fold of the folded back tongue portion 46b' for securing the folded back tongue portion 46b' of the second harness strap 47b to a means 49b' above the second harness strap 47b for releasably attaching the folded back tongue portion 46b' to the second harness strap 47b;
forming means 43 along the V-member 41 for releasably attaching the front side 40 of the hand wearable support 10 to the means 32 for releasably attaching to the attachment portion 30 of the back side 20 of the hand wearable support 10 to form the hand wearable support 10 for a bar code scanner;
releasably attaching the folded back tongue portion 46a' of the first harness strap 47a to the first harness strap 47a;
releasably attaching the folded back tongue portion 46b' of the second harness strap 47b to the second harness strap 47b;
releasably attaching the means 43 along the V-member to the means 32 for releasably along the attachment portion 30 for attaching to the front side 40 of the hand wearable support 10 to form the hand wearable support 10 configurable for scanning operations;
wherein releasably attaching the folded back tongue portion 46a' of the first harness strap 47a to the first harness strap 47a, releasably attaching the folded back tongue portion 46b' of the second harness strap 47b to the second harness strap 47b, and releasably attaching the means 43 along the V-member to the means 32 for releasably along the attachment portion 30 for attaching to the front side 40 of the hand wearable support 10 forms the hand wearable support 10 configurable for scanning operations.

In another aspect, a method for manufacturing a hand wearable support 10 for a bar code scanner comprising the steps of:

forming a back side 20 of the hand wearable support 10 configured to wrap around a back of a hand;

forming the front side 40 of the hand wearable support 10 configured to wrap around a front of a hand when in use;

forming the back side 20 of the hand wearable support 10 by the steps of:

forming a bar code scanner attachment portion 22;

forming a thumb portion 24 along a first side 22a of the back side 20 of the hand wearable support 10, the thumb portion 24 defining a terminal end 24a;

forming a trigger attachment portion 26 along a top side 24b of the thumb portion 24, the trigger attachment portion 26 configured to attachably receive a trigger for activating a bar code scanner;

forming a first strap attachment portion 27a along a first side 26a of the trigger attachment portion 26, the first strap attachment portion 27a including a buckle 29a;

forming a second strap attachment portion 27b along a bottom side 24d of the thumb portion 24, the second strap attachment portion 27b including a buckle 29ba;

forming a bar code scanner attachment portion 22 along an inside end 24c of the thumb portion 24, the bar code scanner attachment portion 22 configured to attachably receive a bar code scanner attachment for receiving a bar code scanner;

forming an attachment portion 30 along the back side 20 of the hand wearable support 10 along an outside end 22b of the bar code scanner attachment portion 22 configured for attachment to a front side of the hand wearable support 40;

forming on the attachment portion along the back side 20 of the hand wearable support 10 a means 32 for securing the attachment portion along the back side 20 of the hand wearable support 10 to the front side of the hand wearable support 40 about a hand;

forming the back side 20 of the hand wearable support 10 by the steps of:

forming a V-member 41, the V-member 41 including a terminal body end 42, a the terminal second arm end 44b extending away from the terminal body end 41 and forming an angle α 44a between the terminal first arm end 44a and the terminal second arm end 44b;

forming a first harness strap 47a, the first harness strap 47a extending from the terminal first arm end 44a of the V-member 41, the first harness strap 47a including a tongue portion 46a, the tongue portion 46a of the first harness strap 47a configured to thread through buckle 29a of the first strap attachment portion 27a and to fold back onto the first harness strap 47a to form a folded back tongue portion 46a', the folded back tongue portion 46a' of the first harness strap 47a including a means 49a underneath the fold of the folded back tongue portion 46a' for securing the folded back tongue portion 46a' of the first harness strap 44a to a means 49a' above the first harness strap 47a for releasably attaching the folded back tongue portion 46a' to the first harness strap 47a;

forming a second harness strap 47b, the second harness strap 47b extending from the terminal first arm end 44b of the V-member 41, the second harness strap 47b including a tongue portion 46b, the tongue portion 46b of the first harness strap 47a configured to thread through buckle 29b of the second strap attachment portion 27b and to fold back onto the second harness strap 47b to form a folded back tongue portion 46b', the folded back tongue portion 46b' of the second harness strap 47b including a means 49b underneath the fold of the folded back tongue portion 46b' for securing the folded back tongue portion 46b' of the second harness strap 47b to a means 49b' above the second harness strap 47b for releasably attaching the folded back tongue portion 46b' to the second harness strap 47b;

forming means 43 along the V-member 41 for releasably attaching the front side 40 of the hand wearable support 10 to the means 32 for releasably attaching to the attachment portion 30 of the back side 20 of the hand wearable support 10 to form the hand wearable support 10 for a bar code scanner;

releasably attaching the folded back tongue portion 46a' of the first harness strap 47a to the first harness strap 47a;

releasably attaching the folded back tongue portion 46b' of the second harness strap 47b to the second harness strap 47b;

releasably attaching the means 43 along the V-member to the means 32 for releasably along the attachment portion 30 for attaching to the front side 40 of the hand wearable support 10 to form the hand wearable support 10 configurable for scanning operations.

The hand wearable support 10 for a bar code scanner in combination with a trigger device and a barcode provides a very efficient wearable scanning system compared to conventional hand wearable bar code scanning systems. The back side of the hand wearable support 10 and the front side 40 of the hand wearable support 10 may be easily assembled to form the support. Releasably attaching the folded back tongue portion 46a' of the first harness strap 47a to the first harness strap 47a, releasably attaching the folded back tongue portion 46b' of the second harness strap 47b to the second harness strap 47b, and releasably attaching the means 43 along the V-member 41 to the means 32 along the attachment portion 30 of the back side 20 of the support 10 for attaching the back side 20 of the hand wearable support 10 to the front side 40 of the hand wearable support 10 forms the hand wearable support 10 configurable for scanning operations.

The hand wearable of this disclosure is easily wearable across a larger population of operators because the first and second harness strap 44a, 44b, releasably attach the folded back tongue portion 47a, 47b of the first and second harness strap 47a, 47b to the first and second harness strap 44a, 44b to allow for easy adjustment across a large population of users. The hand wearable of this disclosure is not a support; yet it fits "like a support" to most hands.

The hand wearable support 10 may fit over a glove.

The hand wearable support of this disclosure is readily adjustable to fit most hand sizes, for example, through the adjustability of one or both first and second harness straps. The V-element of this disclosure to which the first and second harness straps are attached also create a wide range of adjustability for the wearable since it allows the wearable of this disclosure to be adjusted in two directions, namely, the directions defined by the angle of the V-element to which the first and second harness straps are attached.

The two directional adjustments afforded by the hand wearable of this disclosure allows for the hand wearable support to provide greater adjustability to not only the size but also to the form factor of a hand. For example, the hand wearable of this disclosure allows for a single wearable of this disclosure to be adjusted to fit the hand of both an operator with a narrow hand and another operator with a wide hand. As another example, the hand wearable of this disclosure allows for a single wearable of this disclosure to be adjusted to fit other asymmetric variations in hands of different operators such as square hands, rectangular hands, other shaped hands, fleshy hands, elastic hands, stiff hands, and so on. The hand wearable of this disclosure also allows for a single wearable of this disclosure to be adjusted to fit other form factors between the hands of operators such as shorter fingers, webbed fingers, missing finger bones, entirely absent fingers, and so on.

The hand wearable of this disclosure is realized with considerably less material than for example a conventional glove since the strength and adjustability and support of the hand wearable of this disclosure are enhanced by the first and second harness straps and their directional adjustability and not by the need to cover most of the front and the back of the hand with material to provide this strength and adjustability and support.

The hand wearable support of this disclosure can save an organization considerable budget by allowing an organization to move away from a model of buying a separate glove for each operator to a model whereby a plurality of operators share a single hand wearable of this disclosure. This allows the organization to down-size the number of gloves for use in operations to the number of hand wearables that are actually necessary to serve the needs of its operators across all shifts. For instance, one hand wearable of this disclosure may be provided to the number of employees on a shift with those same hand wearables also to be used by employees on each of the other shifts. As another example, an organization may provide a smaller number of hand wearables of this disclosure for each shift with each of the employees on a shift using those smaller number of hand wearables as needed. Where one hand wearable may be useable by several employees, the hand wearable of this disclosure removes the need for the organization to provide a hand wearable to every employee on every shift.

In addition, the removable trigger device and associated electronics lowers the total cost of (TCO) of the product and its sustainability.

Moreover, the hand wearable of this disclosure provides a wearable platform that covers primarily the back of the hand; doing away with the conventional hand wearable like a support that surrounds all of the hand. The absence of a large front also does away with inside wetting of and accumulation of biomaterial from a hand by a support which minimizes hygiene problems presented by conventional supports.

While this disclosure has been described in connection with specific embodiments, it is evident that numerous alternatives, modifications, and variations will be apparent to those skilled in the art within the spirit and scope of the above disclosure.

What is claimed is:

1. A hand wearable support for a bar code scanner, the hand wearable support comprising a back side of the hand wearable support configured to wrap around a back of a hand and a front side of the hand wearable support configured to wrap around a front of a hand when in use;
    wherein the back side of the hand wearable support comprises a bar code scanner attachment portion, a thumb portion, a trigger attachment portion, a first and second strap attachment portions each including a buckle, and an attachment portion along the back side of the hand wearable support;
    wherein the attachment portion along the back side of the hand wearable support includes a means for securing the attachment portion along the back side of the hand wearable support to the front side of the hand wearable support about a hand;
    wherein the front side of the hand wearable support includes a V-member, a first harness strap and a second harness strap attached thereto and extending away from each other at an angle α, and a means along the V-member for releasably attaching the front side of the hand wearable support to the means for releasably attaching to the attachment portion of the back side of the hand wearable support;
    wherein each of the first and second harness strap portions includes a tongue portion configured to thread through the first and second buckle of the first and second strap attachment portions and to fold back onto a first and second means underneath the fold of the folded back tongue portions for securing the folded back tongue portions to the means above the first and second strap attachment portions for releasably attaching the folded back tongue portions to the first and second harness straps;
    wherein the means along the V-member is configured for releasably attaching the front side of the hand wearable support to the means for releasably attaching to the attachment portion of the back side of the hand wearable support to form the hand wearable support for receiving a bar code scanner.

2. The hand wearable support for a bar code scanner according to claim 1:
    wherein releasably attaching the folded back tongue portion of the first harness strap to the first harness strap, releasably attaching the folded back tongue portion of the second harness strap to the second harness strap, and releasably attaching the means along the V-member to the means along the attachment portion of the back side of the hand wearable support for attaching the back side of the hand wearable support to the front side of the hand wearable support forms the hand wearable support configurable for scanning operations.

3. The hand wearable support for a bar code scanner according to claim 1 in combination with a trigger device, wherein the trigger device is releasably attached to the trigger attachment portion.

4. The hand wearable support for a bar code scanner according to claim 1 in combination with a bar code scanner attachment for receiving a bar code scanner wherein the bar code scanner attachment is releasably attached to the bar code scanner attachment portion.

5. The hand wearable support for a bar code scanner according to claim 4 in combination with a bar code scanner, wherein the bar code scanner is releasably attached to the bar code scanner attachment portion.

6. The hand wearable support for a bar code scanner according to claim 5 in combination with a trigger device;
    wherein the trigger device is releasably attached to the trigger attachment portion;
    wherein the trigger device is electrically connected to the bar code scanner;
    wherein activation of the trigger device applies an electrical signal to the bar code scanner.

7. The hand wearable support for a bar code scanner according to claim 6 further comprising a wire, the wire extending from the trigger device to the bar code scanner;
- wherein the electrical signal applied to the bar code scanner from the trigger device is carried along a wire extending from the trigger device to the bar code scanner;
- wherein the back side of the hand wearable support further comprises a releasable thumb portion overlay, the releasable thumb portion overlay configured to overlay a wire tethering the trigger to the bar code scanner.

8. The hand wearable support for a bar code scanner according to claim 1 in combination with a trigger device, a bar code scanner attachment, and a bar code scanner;
- wherein the trigger device is releasably attached to the trigger attachment portion;
- wherein the bar code scanner attachment is releasably attached to the bar code scanner attachment portion;
- wherein the bar code scanner is releasably attached to the bar code scanner attachment portion;
- wherein the combination forming a bar code scanner assembly in the form factor of a support for wear by a user to perform scanning operations.

9. A hand wearable support for a bar code scanner according to claim 1:
- wherein the thumb portion runs along a first side of the back side of the hand wearable support, the thumb portion defining a terminal end;
- wherein the trigger attachment portion runs along a top side of the thumb portion, the trigger attachment portion configured to attachably receive a trigger for activating a bar code scanner;
- wherein the releasable thumb portion overlay is configured to overlay a wire between the trigger to the bar code scanner for carrying electrical signals generated by the trigger to the bar code scanner;
- wherein the first strap attachment portion runs along a first side of the trigger attachment portion;
- wherein the second strap attachment portion runs along a bottom side of the thumb portion, the second strap attachment portion;
- wherein the bar code scanner attachment portion runs along an inside end of the thumb portion, the bar code scanner attachment portion configured to attachably receive a bar code scanner attachment for receiving a bar code scanner;
- wherein the attachment portion along the back side of the hand wearable support 10 runs along an outside end of the bar code scanner attachment portion;
- wherein the V-member includes a terminal body end, a terminal first arm end, a terminal second arm end, the terminal first arm end and the terminal second arm end extending away from the terminal body end and forming an angle α between the terminal first arm end and the terminal second arm end;
- wherein the first harness strap extends from the terminal first arm end of the V-member, the folded back tongue portion of the first harness strap including a means underneath the fold of the folded back tongue portion for securing the folded back tongue portion of the first harness strap to the means above the first harness strap for releasably attaching the folded back tongue portion to the first harness strap;
- a second harness strap the second harness strap extending from the terminal first arm end of the V-member, the folded back tongue portion of the second harness strap including a means underneath the fold of the folded back tongue portion for securing the folded back tongue portion of the second harness strap to the means above the second harness strap for releasably attaching the folded back tongue portion to the second harness strap.

10. The hand wearable support for a bar code scanner according to claim 8:
- wherein the means underneath the fold of the folded back tongue portion of the first harness strap for securing the folded back tongue portion of the first harness strap to the first harness strap is either a hook or loop fastener;
- wherein the means above the first harness strap for releasably attaching the folded back tongue portion of the first harness strap to the first harness strap is a loop fastener if the means underneath the fold of the folded back tongue portion of the first harness strap is a hook fastener or is a hook fastener if the means underneath the fold of the folded back tongue portion of the first harness strap is a loop fastener.

11. The hand wearable support for a bar code scanner according to claim 8:
- wherein the means underneath the fold of the folded back tongue portion of the second harness strap for securing the folded back tongue portion of the second harness strap to the second harness strap is either a hook or loop fastener;
- wherein the means above the second harness strap for releasably attaching the folded back tongue portion of the second harness strap to the second harness strap is a loop fastener if the means underneath the fold of the folded back tongue portion of the second harness strap is a hook fastener is or a hook fastener if the means underneath the fold of the folded back tongue portion of the second harness strap is a loop fastener.

12. The hand wearable support for a bar code scanner according to claim 8:
- wherein the means along the back side of the hand wearable support for securing the attachment portion along the back side of the hand wearable support to the front side of the hand wearable support is either a hook or loop fastener;
- wherein the means along the V-member for releasably attaching the front side of the hand wearable support to the means for releasably attaching to the attachment portion of the back side of the hand wearable support to form the hand wearable support for a bar code scanner is a loop fastener if the means along the V-member for releasably attaching the front side of the hand wearable support to the means for releasably attaching to the attachment portion of the back side of the hand wearable support to form the hand wearable support for a bar code scanner or is a hook fastener if the means along the V-member for releasably attaching the front side of the hand wearable support to the means for releasably attaching to the attachment portion of the back side of the hand wearable support to form the hand wearable support for a bar code scanner is a loop fastener.

13. The hand wearable support for a bar code scanner according to claim 8:
- wherein the means along the back side of the hand wearable support for securing the attachment portion along the back side of the hand wearable support to the front side of the hand wearable support is either a hook or loop fastener;

wherein the means along the V-member for releasably attaching the front side of the hand wearable support to the means for releasably attaching to the attachment portion of the back side of the hand wearable support to form the hand wearable support for a bar code scanner is a loop fastener if the means along the V-member for releasably attaching the front side of the hand wearable support to the means for releasably attaching to the attachment portion of the back side of the hand wearable support to form the hand wearable support for a bar code scanner or is a hook fastener if the means along the V-member for releasably attaching the front side of the hand wearable support to the means for releasably attaching to the attachment portion 30 of the back side of the hand wearable support to form the hand wearable support for a bar code scanner is a loop fastener.

14. The hand wearable support for a bar code scanner according to claim 8:

wherein the bar code scanner attachment is releasably attached to the bar code scanner attachment portion by means of a hook and loop fastener.

15. The hand wearable support for a bar code scanner according to claim 10: wherein the hook and loop fastener means for attaching the bar code scanner attachment portion to the bar code scanner attachment is by either a hook or loop fastener secured to a top side of the bar code scanner attachment and a loop secured to a bottom side of the bar code scanner attachment if the fastener secured to a top side of the bar code scanner attachment is a hook fastener or a hook fastener secured to a bottom side of the bar code scanner attachment if the fastener secured to a top side of the bar code scanner attachment is a loop fastener.

16. The hand wearable support for a bar code scanner according to claim 1, wherein the hand wearable support fits over a glove.

* * * * *